US012574452B2

(12) United States Patent
Jeon et al.

(10) Patent No.: US 12,574,452 B2
(45) Date of Patent: Mar. 10, 2026

(54) ELECTRONIC DEVICE INCLUDING CIRCUIT BOARD ASSEMBLY

(71) Applicant: SAMSUNG ELECTRONICS CO., LTD., Suwon-si (KR)

(72) Inventors: Gyuyeon Jeon, Suwon-si (KR); Jehyun Son, Suwon-si (KR); Youngjoon Ahn, Suwon-si (KR); Minsu Rhee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 428 days.

(21) Appl. No.: 18/113,257

(22) Filed: Feb. 23, 2023

(65) Prior Publication Data

US 2023/0254393 A1 Aug. 10, 2023

Related U.S. Application Data

(63) Continuation of application No. PCT/KR2023/095005, filed on Feb. 8, 2023.

(30) Foreign Application Priority Data

Feb. 8, 2022 (KR) ........................ 10-2022-0016104

(51) Int. Cl.
*H05K 1/11* (2006.01)
*H04M 1/02* (2006.01)
(Continued)

(52) U.S. Cl.
CPC ............ *H04M 1/0277* (2013.01); *H05K 1/02* (2013.01); *H05K 1/0218* (2013.01); *H05K 1/11* (2013.01);
(Continued)

(58) Field of Classification Search
CPC .......... H05K 1/02; H05K 1/0218; H05K 1/11; H05K 1/111; H05K 1/142; H05K 1/18; H05K 1/181
(Continued)

(56) References Cited

U.S. PATENT DOCUMENTS 6,639,304 B1 * 10/2003 Oggioni ............ H01L 23/49816
257/E23.114
9,337,137 B1 * 5/2016 Mills ...................... H01L 23/552
(Continued)

FOREIGN PATENT DOCUMENTS

JP 2019-067994 4/2019
KR 10-2008-0083359 9/2008
(Continued)

OTHER PUBLICATIONS

Extended European Search Report dated Mar. 21, 2026 issued in European Patent Application No. 23753264.3.
(Continued)

*Primary Examiner* — Binh B Tran
(74) *Attorney, Agent, or Firm* — NIXON & VANDERHYE P.C.

(57) ABSTRACT

According to an example embodiment of the disclosure, an electronic device may include a first printed circuit board, a second printed circuit board, multiple first conductive portions, multiple second conductive portions, and multiple third conductive portions. The second printed circuit board may be disposed to at least partially overlap the first printed circuit board. The multiple first conductive portions may be arranged in a first area between the first printed circuit board and the second printed circuit board. The multiple first conductive portions may electrically and mechanically connect the first printed circuit board and the second printed circuit board. The multiple second conductive portions may (Continued)

be arranged in a second area, surrounding at least a part of the first area, between the first printed circuit board and the second printed circuit board. The multiple second conductive portions may electrically and mechanically connect the first printed circuit board and the second printed circuit board. The multiple third conductive portions may be arranged in the second area. The multiple third conductive portions may electrically connect at least two of the multiple second conductive portions. The multiple second conductive portions may electrically connect a first ground area included in the first printed circuit board and a second ground area included in the second printed circuit board.

18 Claims, 9 Drawing Sheets

(51) Int. Cl.
| | |
|---|---|
| *H05K 1/02* | (2006.01) |
| *H05K 1/14* | (2006.01) |
| *H05K 1/18* | (2006.01) |
| *H05K 1/181* | (2026.01) |
| *H05K 9/00* | (2006.01) |

(52) U.S. Cl.
CPC ............. *H05K 1/111* (2013.01); *H05K 1/142* (2013.01); *H05K 1/18* (2013.01); *H05K 1/181* (2013.01); *H05K 9/0081* (2013.01)

(58) Field of Classification Search
USPC ........................................................ 361/767
See application file for complete search history.

(56) References Cited

U.S. PATENT DOCUMENTS

| | | | |
|---|---|---|---|
| 10,332,843 | B2 | 6/2019 | Baek et al. |
| 10,398,026 | B2 | 8/2019 | Goto et al. |
| 10,756,004 | B1 | 8/2020 | Elsherbini et al. |
| 11,196,146 | B2 | 12/2021 | Moallem et al. |
| 11,201,108 | B2 | 12/2021 | Lee et al. |
| 2008/0158844 | A1 | 7/2008 | Kim |
| 2008/0289853 | A1 | 11/2008 | Sakai et al. |
| 2015/0325529 | A1 | 11/2015 | Choi |
| 2015/0364428 | A1 | 12/2015 | Hayashiyama et al. |
| 2019/0037683 | A1 | 1/2019 | Han et al. |
| 2019/0043811 | A1 | 2/2019 | Chen et al. |
| 2020/0035589 | A1* | 1/2020 | Lee ...................... H01L 23/552 |

FOREIGN PATENT DOCUMENTS

| | | |
|---|---|---|
| KR | 10-2015-0127369 | 11/2015 |
| KR | 10-2020-0011169 | 2/2020 |

OTHER PUBLICATIONS

Search Report and Written Opinion dated May 24, 2023 issued in International Patent Application No. PCT/KR2023/095005.
Korean Office Action dated Sep. 19, 2025 issued in Korean Patent Application No. 10-2022-0016104 and English translation, 21 pp.

* cited by examiner

FIG. 1

ELECTRONIC DEVICE INCLUDING CIRCUIT BOARD ASSEMBLY

CROSS-REFERENCE TO RELATED APPLICATIONS

This application is a continuation of International Application No. PCT/KR2023/095005 designating the United States, filed on Feb. 8, 2023, in the Korean Intellectual Property Receiving Office and claiming priority to Korean Patent Application No. 10-2022-0016104, filed on Feb. 8, 2022, in the Korean Intellectual Property Office, the disclosures of which are incorporated by reference herein in their entireties.

BACKGROUND

Field

The disclosure relates to an electronic device including a circuit board assembly.

Description of Related Art

An electronic device may include a circuit board assembly including a printed circuit board for arranging multiple electrical elements or electrically connecting multiple electrical elements.

While electronic devices are becoming slimmer, various electrical elements for supporting various functions are provided in the limited space of an electronic device. Therefore, there may be electromagnetic influence between electrical elements. A circuit board assembly may include a printed circuit board and a circuit structure in which multiple electronic components electrically connected to signal lines included in the printed circuit board are concentrated, but electromagnetic noise due to the circuit structure may degrade the performance of electronic devices.

SUMMARY

Embodiments of the disclosure may provide an electronic device including a circuit board assembly capable of reducing electromagnetic noise.

According to an example embodiment of the disclosure, an electronic device may include: a first printed circuit board, a second printed circuit board, multiple first conductive portions, multiple second conductive portions, and multiple third conductive portions. The second printed circuit board may be disposed to at least partially overlap the first printed circuit board. The multiple first conductive portions may be arranged in a first area between the first printed circuit board and the second printed circuit board. The multiple first conductive portions may electrically and mechanically connect the first printed circuit board and the second printed circuit board. The multiple second conductive portions may be arranged in a second area, surrounding at least a part of the first area, between the first printed circuit board and the second printed circuit board. The multiple second conductive portions may electrically and mechanically connect the first printed circuit board and the second printed circuit board. The multiple third conductive portions may be arranged in the second area. The multiple third conductive portions may electrically connect at least two of the multiple second conductive portions. The multiple second conductive portions may electrically connect a first ground area included in the first printed circuit board and a second ground area included in the second printed circuit board.

According to an example embodiment of the disclosure, a circuit board assembly may include: a first printed circuit board, a second printed circuit board, multiple first conductive portions, multiple second conductive portions, and multiple third conductive portions. The second printed circuit board may be disposed to at least partially overlap the first printed circuit board. The multiple first conductive portions may be arranged in a first area between the first printed circuit board and the second printed circuit board. The multiple first conductive portions may electrically and mechanically connect the first printed circuit board and the second printed circuit board. The multiple second conductive portions may be arranged in a second area, surrounding at least a part of the first area, between the first printed circuit board and the second printed circuit board. The multiple second conductive portions may electrically and mechanically connect the first printed circuit board and the second printed circuit board. The multiple third conductive portions may be arranged in the second area. The multiple third conductive portions may electrically connect at least two of the multiple second conductive portions. An electronic component disposed on a surface of the second printed circuit board, facing the first printed circuit board, may be inserted in an opening provided through the first printed circuit board. The multiple first conductive portions may be positioned to at least partially surround the opening of the first printed circuit board. The multiple second conductive portions may electrically connect a first ground area included in the first printed circuit board and a second ground area included in the second printed circuit board.

An electronic device including a circuit board assembly according to various example embodiments of the disclosure may reduce electromagnetic noise related to a circuit board assembly.

Effects which may be obtained or predicted through various embodiments of the disclosure will be directly or indirectly disclosed in the detailed description of an embodiment of the disclosure.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIG. 1 is a block diagram illustrating an example electronic device in a network environment according to various embodiments;

DETAILED DESCRIPTION

Figure 2:
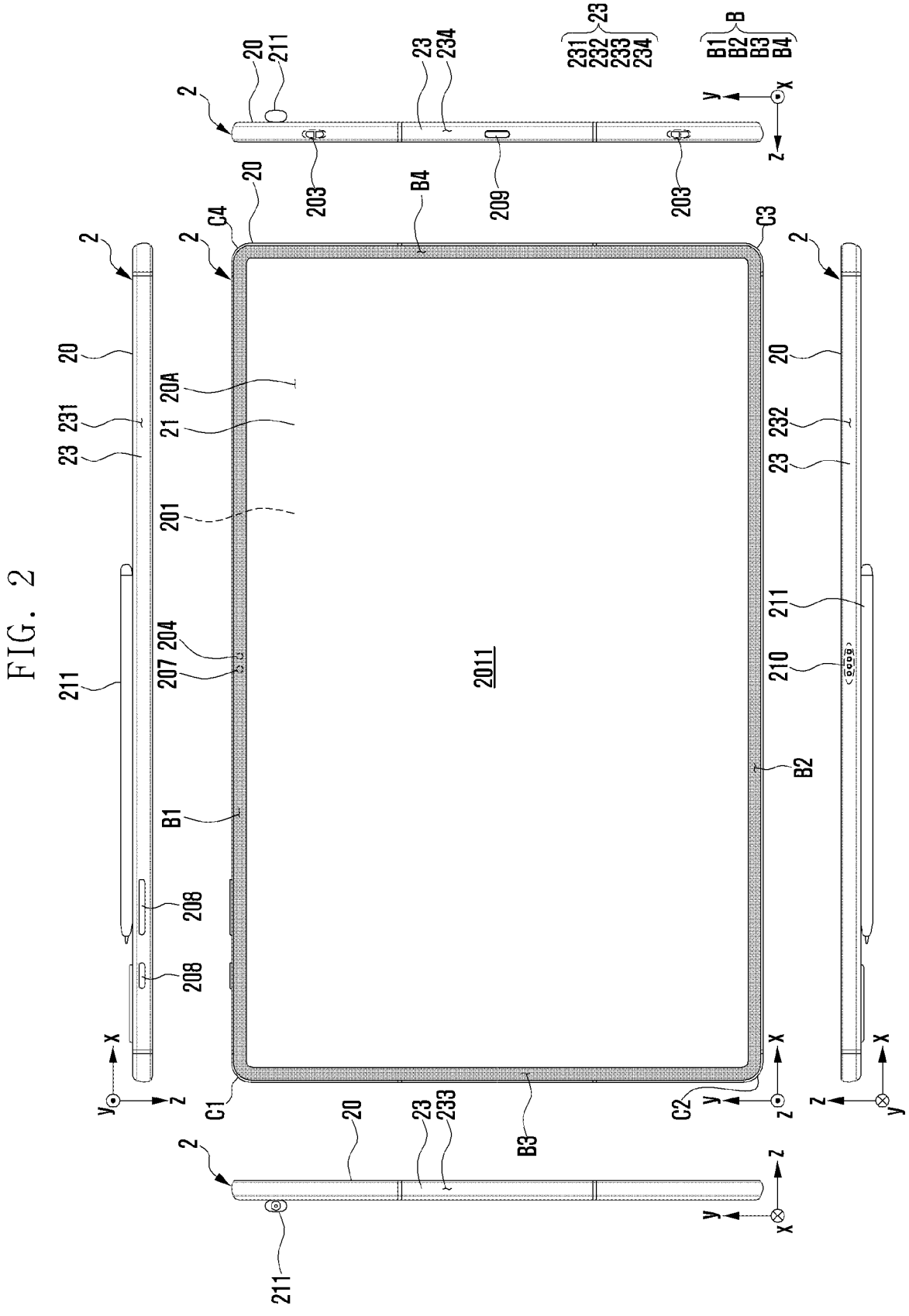
FIGS. 2 and 3 are diagrams illustrating various views showing an electronic device according to various embodiments.

Hereinafter, various example embodiments of the disclosure disclosed herein will be described in greater detail with reference to the accompanying drawings.

Figure 1:
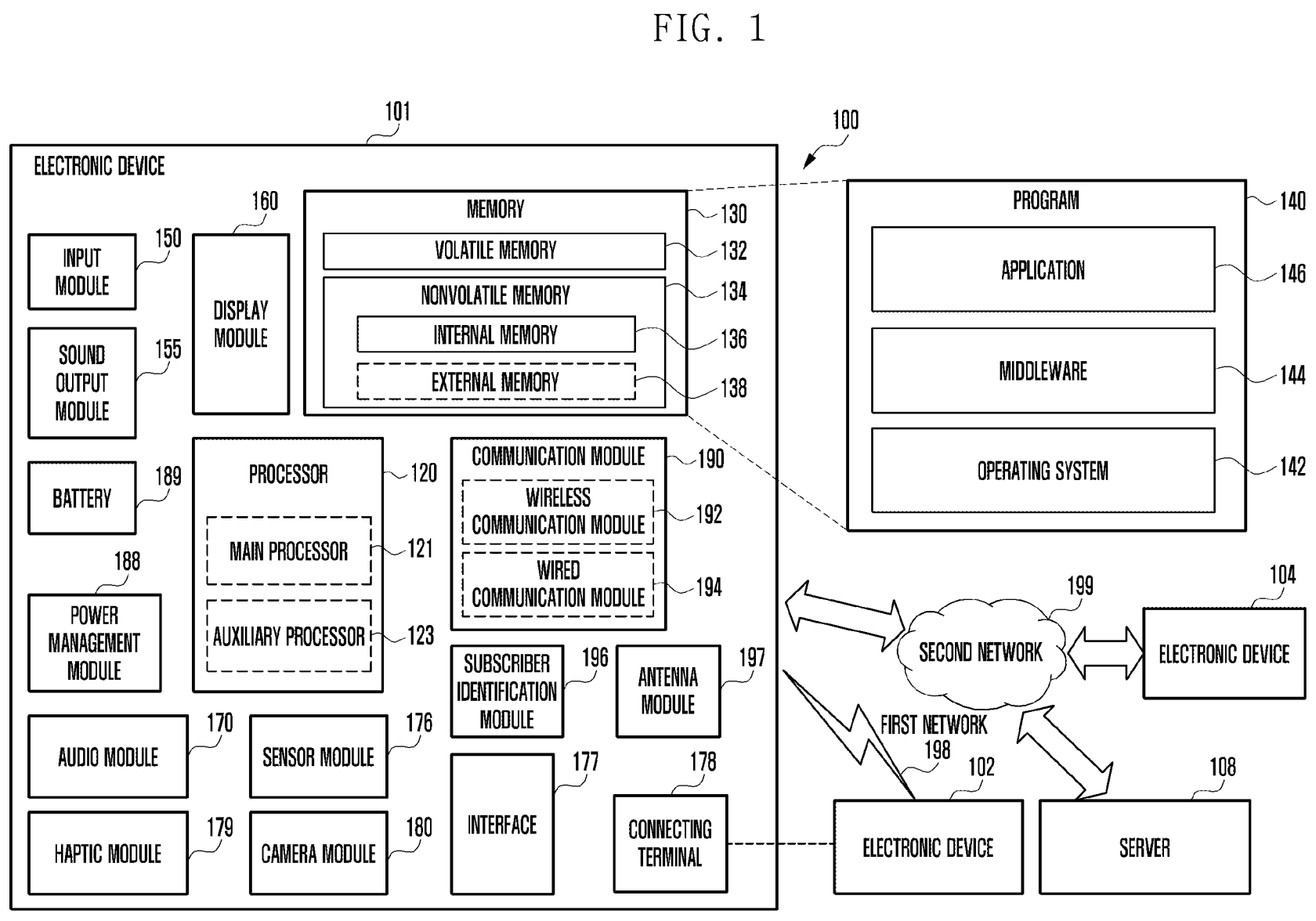

FIG. 1 is a block diagram illustrating an example electronic device 101 in a network environment 100 according to various embodiments.

Referring to FIG. 1, the electronic device 101 in the network environment 100 may communicate with an external electronic device 102 via a first network 198 (e.g., a short-range wireless communication network), or at least one of an external electronic device 104 or a server 108 via a second network 199 (e.g., a long-range wireless communication network). The electronic device 101 may communicate with the external electronic device 104 via the server 108. The electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, and/or an antenna module 197. In various embodiments of the disclosure, at least one (e.g., the connection terminal 178) of the components may be omitted from the electronic device 101, or one or more other components may be added in the electronic device 101. In various embodiments of the disclosure, some of the components may be implemented as single integrated circuitry. For example, the sensor module 176, the camera module 180, or the antenna module 197 may be implemented as embedded in single component (e.g., the display module 160).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in a volatile memory 132, process the command or the data stored in the volatile memory 132, and store resulting data in a non-volatile memory 134. The processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., a sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123. According to an embodiment of the disclosure, the auxiliary processor 123 (e.g., a neural network processing device) may include a hardware structure specified for processing an artificial intelligence model. The artificial intelligence model may be created through machine learning. Such learning may be performed, for example, in the electronic device 101 itself on which the artificial intelligence model is performed, or may be performed through a separate server (e.g., the server 108). The learning algorithms may include, for example, supervised learning, unsupervised learning, semi-supervised learning, or reinforcement learning, but is not limited thereto. The artificial intelligence model may include a plurality of artificial neural network layers. The artificial neural network may be any of a deep neural network (DNN), a convolutional neural network (CNN), a recurrent neural network (RNN), a restricted Boltzmann machine (RBM), a deep belief network (DBN), a bidirectional recurrent DNN (BRDNN), a deep Q-network, or a combination of two or more of the above-mentioned networks, but is not limited the above-mentioned examples. In addition to the hardware structure, the artificial intelligence model may additionally or alternatively include a software structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 and/or the non-volatile memory 134.

The program 140 may be stored in the memory 130 as software, and may include, for example, an operating system (OS) 142, middleware 144, and/or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record, and the receiver may be used for incoming calls. The receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. The display module 160 may include touch circuitry (e.g., a touch sensor) adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input module 150, or output the sound via the sound output module 155 or a headphone of an external electronic device (e.g., the external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. The interface 177 may include, for example, a high-definition multimedia interface (HDMI), a universal serial bus (USB) interface, a secure digital (SD) card interface, and/or an audio interface.

The connecting terminal 178 may include a connector via which the electronic device 101 may be physically connected with the external electronic device (e.g., the external electronic device 102). The connecting terminal 178 may include, for example, an HDMI connector, a USB connector, an SD card connector, and/or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. The camera module 180 may include one or more lenses, image sensors, ISPs, or flashes.

The power management module 188 may manage power supplied to or consumed by the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, and/or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more CPs that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH, wireless-fidelity (Wi-Fi) direct, or IR data association (IrDA)) or the second network 199 (e.g., a long-range communication network, such as a legacy cellular network, a 5th generation (5G) network, a next generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a 4th generation (4G) network, and next-generation communication technology, e.g., new radio (NR) access technology. The NR access technology may support high-speed transmission of high-capacity data (e.g., enhanced mobile broadband (eMBB)), minimization of terminal power and connection of multiple terminals (massive machine type communications (mMTC)), or high reliability and low latency (ultra-reliable and low-latency communications (URLLC)). The wireless communication module 192 may support a high-frequency band (e.g., a mmWave band) to achieve, for example, a high data transmission rate. The wireless communication module 192 may support various technologies for securing performance in a high-frequency band, such as beamforming, massive multiple-input and multiple-output (MIMO), full-dimensional MIMO (FD-MIMO), array antenna, analog beam-forming, or large-scale antenna. The wireless communication module 192 may support various requirements specified in the electronic device 101, an external electronic device (e.g., external the electronic device 104), or a network system (e.g., the second network 199). According to an embodiment of the disclosure, the wireless communication module 192 may support a peak data rate for implementing eMBB (e.g., 20 Gbps or more), loss coverage for implementing mMTC (e.g., 164 dB or less), or U-plane latency for realizing URLLC (e.g., 0.5 ms or less for each of downlink (DL) and uplink (UL) or 1 ms or less for round trip).

The antenna module 197 may transmit or receive a signal or power to or from the outside (e.g., the external electronic device) of the electronic device 101. The antenna module 197 may include an antenna including a radiating element including a conductive material or a conductive pattern formed in or on a substrate (e.g., a printed circuit board (PCB)). The antenna module 197 may include a plurality of antennas (e.g., an antenna array). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a PCB, an RFIC that is disposed on or adjacent to a first surface (e.g., the bottom surface) of the PCB and is capable of supporting a prede-termined high-frequency band (e.g., a mmWave band), and a plurality of antennas (e.g., array antennas) that is disposed on or adjacent to a second surface (e.g., the top surface or the side surface) of the PCB and is capable of transmitting or receiving a signal of the predetermined high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external elec-tronic device 104 via the server 108 coupled with the second network 199. Each of the external electronic devices 102 or 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide an ultra-low delay service using, for example, distributed computing or MEC. In an embodiment of the disclosure, the external electronic device 104 may include an internet of things (IoT) device. The server 108 may be an intelligent server using machine learning and/or neural networks. According to an embodiment of the disclosure, the external electronic device 104 or the server 108 may be included in the second network 199. The electronic device 101 may be applied to an intelligent service (e.g., smart home, smart city, smart car, or healthcare) based on 5G communication technology or IoT-related technology.

An electronic device according to an embodiment of the disclosure may be one of various types of electronic devices. The electronic devices may include a portable communica-tion device (e.g., a smartphone), a computer device, a portable multimedia device, a portable medical device, a camera, a wearable device, a home appliance, or the like. However, the electronic device is not limited to any of those described above.

Various embodiments of the disclosure and the terms used herein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B,"

"at least one of A and B," "at least one of A or B," "A, B, or C," "at least one of A, B, and C," and "at least one of A, B, or C," may include any one of, or all possible combina-tions of the items enumerated together in a corresponding one of the phrases. As used herein, such terms as "1st" and "2nd," or "first" and "second" may be used to simply distinguish a corresponding component from another, and does not limit the components in other aspect (e.g., impor-tance or order). If an element (e.g., a first element) is referred to, with or without the term "operatively" or "communica-tively," as "coupled with," "coupled to," "connected with," or "connected to" another element (e.g., a second element), the element may be coupled with the other element directly (e.g., wiredly), wirelessly, or via a third element.

The term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more func-tions. For example, according to an embodiment of the disclosure, the module may be implemented in a form of an application-specific integrated circuit (ASIC).

Various embodiments as set forth herein may be imple-mented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAY-STORE™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described com-ponents may be omitted, or one or more other components may be added. Alternatively or additionally, a plurality of components (e.g., modules or programs) may be integrated into a single component. In such a case, the integrated component may perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 3:
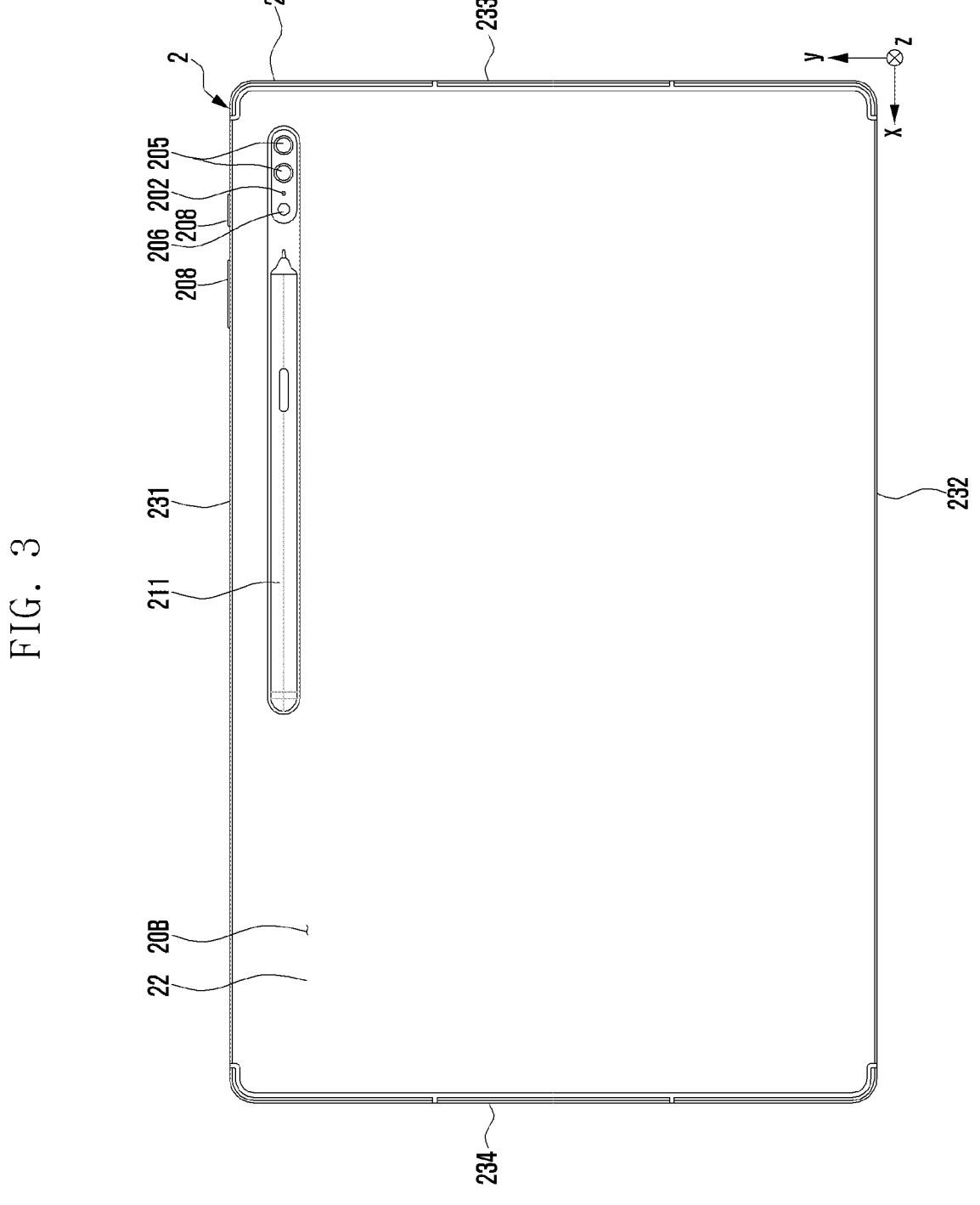

FIGS. 2 and 3 are diagrams illustrating various views showing an electronic device 2 according to various embodiments.

Referring to FIGS. 2 and 3, an electronic device 2 (e.g., the electronic device 101 in FIG. 1) may include a housing 20 forming the exterior of the electronic device 2. For example, the housing 20 may include a front surface 20A of the electronic device 2, a rear surface 20B of the electronic device 2, and a side surface of the electronic device 2, which surrounds the space between the front surface 20A and the rear surface 20B. In various embodiments, the housing 20 may be refer, for example, to a structure (e.g., a housing structure) for providing at least a part of the front surface 20A, the rear surface 20B, and the side surface. In various embodiments of the disclosure, for the convenience of explanation, a direction, in which a display 201 included in the electronic device 2 is visually exposed (e.g., visible), may be referred to, for example, as the front surface 20A of the electronic device 2, and a direction opposite thereto may refer, for example, to and used as the rear surface 20B of the electronic device 2. The terms "exposed", "visible" and "viewable" may be used interchangeably and include a display including a cover, front plate, protective layer or the like disposed on the display.

According to an embodiment, the housing 20 may include a front plate 21, a rear plate 22, and/or a lateral member 23. The front surface 20A of the electronic device 2 may have at least a part provided by the front plate 21. The front plate 21 may be substantially transparent, and for example, may include a polymer plate or a glass plate including various coating layers. The rear surface 20B of the electronic device 2 may have at least a part provided by the rear plate 22. The rear plate 22 may be substantially opaque. For example, the rear plate 22 may be formed by coated or colored glass, ceramic, polymer, metal, or a combination of at least two of the above materials. For another example, the rear plate 22 may include aluminum, an aluminum alloy, magnesium, a magnesium alloy, or an alloy including iron (e.g., stainless steel). The lateral member 23 may surround at least a part of a space between the front plate 21 and the rear plate 22. The side surface of the electronic device 2 may have at least a part provided by the lateral member 23. The lateral member 23 may be an element substantially forming the side surface of the electronic device 2, and may be referred to as various other terms such as "a side bezel structure" or "a bezel structure". The lateral member 23 may include metal and/or polymer. The lateral member 23 may be coupled to the front plate 21 and the rear plate 22. For example, the lateral member 23 may be coupled to the front plate 21 or the rear plate 22 by mechanical fastening using a mechanical fastening element such as a screw or bonding using an adhesive material.

According to various embodiments, the rear plate 22 and the lateral member 23 may be integrally formed and may include the same material (e.g., a metal material such as aluminum and/or a non-metal material such as a polymer). For example, a structure in which the rear plate 22 and the lateral member 23 are integrally formed may be referred to as a "case". A portion of the case which forms the rear surface 20B of the electronic device 2 is not limited to the term "a rear plate" and may be referred to as various other terms such as "a bottom" or "a rear part". A portion of the case which forms the side surface of the electronic device 2 may be not limited to the term "a lateral member", and may be referred to as various other terms such as "a side wall", "a side", "a border", or "a side part".

According to an embodiment, the lateral member 23 may include a first side wall 231, a second side wall 232, a third side wall 233, and/or a fourth side wall 234. When seen from above the front surface 20A of the electronic device 2 (e.g., when seen in the −z-axis direction), the first side wall 231 and the second side wall 232 may be spaced apart from each other in a first direction (e.g., the y-axis direction), and may be substantially parallel in a second direction (e.g., the x-axis direction) orthogonal to the first direction. The third side wall 233 may connect one end of the first side wall 231 and one end of the second side wall 232, and may be perpendicular to the first side wall 231 or the second side wall 232 when seen from above the front surface 20A of the electronic device 2. The fourth side wall 234 may connect the other end of the first side wall 231 and the other end of the second side wall 232, and be perpendicular to the first side wall 231 or the second side wall 232 and be substantially parallel to the third side wall 233 when seen from above the front surface 20A of the electronic device 2. The first side wall 231 may provide a first side surface of the side surfaces of the electronic device 2, and the second side wall 232 may provide a second side surface of the side surfaces of the electronic device 2. The third side wall 233 may provide a third side surface of the side surfaces of the electronic device 2, and the fourth side wall 234 may provide a fourth side surface of the side surfaces of the electronic device 2. A first corner C1, at which the first side wall 231 and the third side wall 233 are connected to each other, may have a curved shape to seamlessly connect the first side surface and the third side surface. A second corner C2, at which the second side wall 232 and the third side wall 233 are connected to each other, may have a curved shape to seamlessly connect the second side surface and the third side surface. A third corner C3, at which the second side wall 232 and the fourth side wall 234 are connected to each other, may have a curved shape to seamlessly connect the second side surface and the fourth side surface. A fourth corner C4, at which the first side wall 231 and the fourth side wall 234 are connected to each other, may have a curved shape to seamlessly connect the first side surface and the fourth side surface.

According to an embodiment, the electronic device 2 may include a display 201, a first audio module 202, multiple second audio modules 203, a first camera module 204, multiple second camera modules 205, a light-emitting module 206, a sensor module 207, multiple input modules 208, a first connection terminal module 209, a second connection terminal module 210, and/or a pen input device 211. At least one of the elements may be omitted from the electronic device 2, and other elements may be additionally included therein.

The display 201 may be positioned in an inner space of the housing 20, and a display area (e.g., a screen display area or an active area) 2011 of the display 201 may be visible through the front plate 21. The electronic device 2 may be configured such that the display area 2011 seen through the front plate 21 is implemented to be seen as large as possible (e.g., a large screen or a full screen). For example, the display 201 may be implemented to have an outer shape which is substantially the same as the outer shape of the front plate 21. For another example, the edge of the display

201 and the edge of the front plate 21 may be formed to be substantially the same. In an embodiment, the display 201 may include a touch detection circuit. In various embodiments, the display 201 may include a pressure sensor capable of measuring the intensity (pressure) of touch. In various embodiments, the display 201 may be coupled to a digitizer (e.g., an electromagnetic induction panel) for detecting a magnetic field type electronic pen (e.g., stylus pen), or may be positioned adjacent to a digitizer. In various embodiments, the display 201 may include a digitizer.

For example, the first audio module 202 may include a microphone positioned in the inner space of the housing 20, and a microphone hole formed through the rear surface 20B of the electronic device 2 to correspond to the microphone. The position or number of an audio module associated with the microphone is not limited to the illustrated example, and may be various. In various embodiments, the electronic device 2 may include multiple microphones used for detecting the direction of sound.

For example, the multiple second audio modules 203 may include a speaker positioned in the inner space of the housing 20, and a speaker hole formed through the side surface to correspond to the speaker. The position or number of the second audio modules is not limited to the illustrated example, and may be various. In various embodiments, the microphone hole and the speaker hole may be implemented as one hole. In various embodiments, the second audio modules may include a piezo speaker in which a speaker hole is omitted.

The first camera module 204 (e.g., a front camera module) may be positioned in the inner space of the housing 20 to correspond to the front surface 20A. The multiple second camera modules 205 (e.g., rear camera modules) may be positioned in the inner space of the housing 20 to correspond to the rear surface 20B. The first camera module 204 and/or each of the multiple second camera modules 205 may include one or multiple lenses, an image sensor, and/or an image signal processor. The position or number of the first camera module or the second camera modules is not limited to the illustrated embodiment, and may be various.

According to an embodiment, the first camera module 204 may be positioned in the inner space of the housing 20 to correspond to a bezel area B of the front plate 21. The bezel area B may be a portion of the front plate 21, with which the display area 2011 does not overlap when seen from above the front surface 20A of the electronic device 2 (e.g., when seen in the −z-axis direction). For example, the bezel area B may be formed in a shape surrounding the display area 2011 when seen from above the front surface 20A (e.g., a rectangular annular shape when seen from above the front surface 20A). The bezel area B may include a first bezel area B1, a second bezel area B2, a third bezel area B3, and/or a fourth bezel area B4. The first bezel area B1 may be positioned adjacent to the first side wall 231 so as to correspond to the first side wall 231. The second bezel area B2 may be positioned adjacent to the second side wall 232 so as to correspond to the second side wall 232. The third bezel area B3 may be positioned adjacent to the third side wall 233 so as to correspond to the third side wall 233. The fourth bezel area B4 may be positioned adjacent to the fourth side wall 234 so as to correspond to the fourth side wall 234. In an embodiment, the first camera module 204 may be positioned in the inner space of the housing 20 to correspond to the first bezel area B1, and the first bezel area B1 may include a first transparent area (or a first light-transmitting area) corresponding to the first camera module 204. External light may reach the first camera module 204 through the first transparent area of the bezel area B.

According to various embodiments, the display area 2011 may be implemented as large as possible and thus implemented such that the bezel area B is reduced or is substantially absent, differently from the illustrated example. In case that the first bezel area B1 is reduced or is substantially absent differently from the illustrated example, the first camera module 204 may be positioned below or beneath the display area 2011. Therefore, a function (e.g., image photographing) associated with the first camera module 204 may be performed while the position of the first camera module 204 is not visually distinguished (or exposed). The first camera module 204 may be positioned on the rear surface of the display area 2011 or below the display area 2011. The first camera module 204 may include a hidden display rear camera (e.g., an under-display camera (UDC)). In various embodiments, the first camera module 204 may be aligned with and positioned in a recess formed on the rear surface of the display area 2011. The first camera module 204 may be inserted in a recess formed on the rear surface of the display area 2011. The first camera module 204 may be disposed to overlap the display area 2011, and may obtain an image of an external subject without being visually exposed to the outside. A part of the display area 2011, which at least partially overlaps the first camera module 204, may include a different pixel structure and/or wire structure compared to the other areas. For example, a part of the display area 2011, which at least partially overlaps the first camera module 204, may have a different pixel density compared to the other areas. A pixel structure and/or wire structure formed in a partial area, which at least partially overlaps the first camera module 204, of the display area 2011 may reduce the loss of light between the outside of the electronic device 2 and the first camera module 204. In various embodiments, a pixel may not be disposed in a part of the display area 2011, which at least partially overlaps the first camera module 204. In various embodiments, the display area 2011 may include a first opening aligned with first camera module 204. External light may reach the first camera module 204 through the front plate 21 and the first opening of the display area 2011. For example, the first opening formed in the display area 2011 may be formed in a through-hole shape or a notch shape.

According to various embodiments, the electronic device 2 may further include a light-emitting module (a light source) (not shown) positioned in the inner space of the housing 20 to correspond to the front surface 20A. For example, the light-emitting module may be configured to provide status information of the electronic device 2 in the form of light. In various embodiments, the light-emitting module may provide a light source operating in association with an operation of the first camera module 204. For example, the light-emitting module may include an LED, an IR LED, or a xenon lamp.

The multiple second camera modules 205 may have different attributes (e.g., an angle of view) or functions, and for example, may include a dual camera or a triple camera. The multiple second camera modules 205 may include multiple camera modules including lenses having view angles different from each other, and the electronic device 2 may control to change the angles of view of the camera modules, which are performed in the electronic device 2, based on a user selection. For example, the multiple second camera modules 205 may include at least one of a wide-angle camera, a telephoto camera, a color camera, a monochrome camera, or an infrared (IR) camera (e.g., a time of flight (TOF) camera or a structured light camera). In various embodiments, the IR camera may also operate as at least a part of a sensor module. The light-emitting module 206 (e.g., a flash) may include a light source for the multiple second camera modules 205. For example, the light-emitting module 206 may include an LED or a xenon lamp.

In an embodiment, when seen from above the rear surface 20B of the electronic device 2 (e.g., when seen in the +z-axis direction), the multiple second camera modules 205, the first audio module 202, or the light-emitting module 206 may be positioned closer to the first side wall 231 than the second side wall 232, and be positioned close to the fourth side wall 234 than the third side wall 233. When seen from above the rear surface 20B of the electronic device 2, the multiple second camera modules 205, the first audio module 202, and the light-emitting module 206 may be arranged in a direction (e.g., +the x-axis direction) directed from the third side wall 233 to the fourth side wall 234. When seen from above the rear surface 20B of the electronic device 2, the first audio module 202 may be positioned between the multiple second camera modules 205 and the light-emitting module 206.

For example, the sensor module 207 may generate an electrical signal or data value corresponding to an internal operation state of the electronic device 2 or an external environmental state. In an embodiment, the sensor module 207 may include an optical sensor positioned in the inner space of the housing 20 to correspond to the front surface 20A. For example, the optical sensor may include a proximity sensor or an illuminance sensor. The optical sensor may be positioned in the inner space of the housing 20 to correspond to the bezel area B of the front plate 21. In an embodiment, the optical sensor may be positioned in the housing 20 to correspond to the first bezel area B1, and the first bezel area B1 may include a second transparent area (or a second light-transmitting area) corresponding to the optical sensor. External light may reach the optical sensor through the second transparent area of the bezel area B. The first transparent area of the first bezel area B1, which corresponds to the first camera module 204, and the second transparent area of the first bezel area B1, which corresponds to the sensor module 207 may be positioned adjacent to each other. The remaining areas other than the first transparent area and the second transparent of the first bezel area B1 may be formed substantially opaque. For example, the front plate 21 may include a substantially transparent plate (e.g., a glass plate or a polymer plate) and a layer (e.g., light shielding sheet) made of an opaque material, which is disposed in an area other than the first transparent area and the second transparent area of the portion corresponding to the bezel area B of the transparent plate. An opaque area of the bezel area B may correspond to a portion on which the layer made of an opaque material is disposed. The layer made of an opaque material may be disposed on the transparent plate by various methods such as application or printing. In various embodiments, one transparent area may be formed to replace the first transparent area of the first bezel area B1, which corresponds to the first camera module 204, and the second transparent area of the first bezel area B1, which corresponds to the sensor module 207.

According to various embodiments, the display area 2011 may be implemented as large as possible and thus implemented such that the bezel area B is reduced or is substantially absent differently from the illustrated example. Differently from the illustrated example, in case that the first bezel area B1 is reduced or is substantially absent, the sensor module 207 (e.g., an optical sensor) may be positioned on the rear surface of the display area 2011, or below or beneath the display area 2011. Therefore, a function (e.g., a sensing function) associated with the sensor module 207 may be performed while the position of the sensor module 207 is not visually distinguished (or exposed). In various embodiments, the sensor module 207 may be aligned with and positioned in a recess formed on the rear surface of the display area 2011. The sensor module 207 may be inserted in a recess formed on the rear surface of the display area 2011. The sensor module 207 may be disposed to overlap the display area 2011, and may perform a sensing function without being visually exposed to the outside. A part of the display area 2011, which at least partially overlaps the sensor module 207, may include a different pixel structure and/or wire structure compared to the other areas. For example, a part of the display area 2011, which at least partially overlaps the sensor module 207, may have a different pixel density compared to the other areas. A pixel structure and/or wire structure formed in a partial area of the display area 2011, which at least partially overlaps the sensor module 207, may reduce the loss of light between the outside and the sensor module 207. In various embodiments, a pixel may not be disposed in a part of the display area 2011, which at least partially overlaps the sensor module 207. In various embodiments, the electronic device 2 may include a biometric sensor (e.g., a fingerprint sensor) positioned below the display 201. The biometric sensor may be implemented in an optical type, an electrostatic type, or an ultrasonic type, and the position or number thereof may be various. In various embodiments, the display area 2011 may include a second opening aligned in the sensor module 207 (e.g., an optical sensor). External light may reach the sensor module 207 through the front plate 21 and the second opening of the display area 2011. For example, the second opening formed in the display area 2011 may be formed in a through-hole shape or a notch shape. In various embodiments, one opening may be formed to replace the first opening corresponding to the first camera module 204 and the second opening corresponding to the sensor module 207, of the display area 2011, and the one opening may be formed in a through-hole form or a notch form. The electronic device 2 may further include at least one of various other sensor modules, for example, a gesture sensor, a gyro sensor, a barometric pressure sensor, a magnetic sensor, an acceleration sensor, a grip sensor, a color sensor, an infrared (IR) sensor, a temperature sensor, or a humidity sensor.

For example, the multiple input modules 208 may include key input devices. The key input devices may be positioned in an opening formed on the side surface thereof. In various embodiments, the electronic device 2 may not include some or all of the key input devices, and a key input device not included therein may be implemented as a soft key using the display 201. The position or number of the input modules may be various, and in various embodiments, the input modules may include at least one sensor module.

For example, the first connection terminal module (e.g., a connector module or an interface terminal module) 209 may include a connector (or an interface terminal) (e.g., a universal serial bus (USB) connector or a high definition multimedia interface (HDMI) connector) positioned in the inner space of the housing 20, and a connector hole formed through the side surface thereof to correspond to the connector. For example, the second connection terminal module (e.g., a second connector module or a second interface terminal module) 210 may include multiple terminals (or contact terminals) exposed through the side surface. The electronic device 2 may transmit and/or receive power and/or data to and/or from an external electronic device electrically connected to the first connection terminal module 209 and the second connection terminal module 210. The position or number of the connection terminal modules is not limited to the illustrated example, and may be various. In various embodiments, the electronic device 2 may further include a connection terminal module for connecting a memory card (e.g., a secure digital memory (SD) card or a subscriber identity module (SIM) card).

According to an embodiment, the pen input device 211 (e.g., a stylus pen) may be attached to and detached from the housing 20. For example, the pen input device 211 may be attached to and detached from the rear surface 20B of the housing 20. The rear surface 20B may include a pen attachment area to which the pen input device 211 may be attached. The pen attachment area may be implemented to be visually distinguishable on the rear surface 20B. In an embodiment, when seen from above the rear surface 20B (e.g., when seen in the +z-axis direction), the multiple second camera modules 205, the first audio module 202, the light-emitting module 206, and the pen attachment area may be arranged in a direction (e.g., +the x-axis direction) directed from the third side wall 233 to the fourth side wall 234. The light-emitting module 206 may be positioned between the pen attachment area and the first audio module 202 when seen from above the rear surface 20B.

According to an embodiment, the pen input device 211 may be attached to the housing 20 using a magnetic body. For example, the pen input device 211 may be attached to the housing 20 by the attractive force between a magnetic body included in the pen input device 211 and a magnetic body positioned (or accommodated) in the housing 20. In various embodiments, a method of attaching or detaching the pen input device 211 to or from the side surface or the front surface 20A of the housing 20 may be implemented. For example, the bezel area B, as a pen attachment area, may be utilized as an area in which the pen input device 211 is attached to or detached from the front surface 20A. The pen input device 211 may be attached to the housing 20 by various other methods. For example, a method of inserting the pen input device 211 into the inner space of the housing 20 may be provided.

According to an embodiment, the pen input device 211 may be implemented in an electromagnetic induction method (e.g., an electro-magnetic resonance (EMR) method). The pen input device 211 may include a resonance circuit, and the resonance circuit may operate in association with an operation of an electromagnetic induction panel disposed in the inner space of the housing 20. In various embodiments, the pen input device 211 may be implemented in an active electrical stylus (AES) method or an electric coupled resonance (ECR) method.

Figure 4:
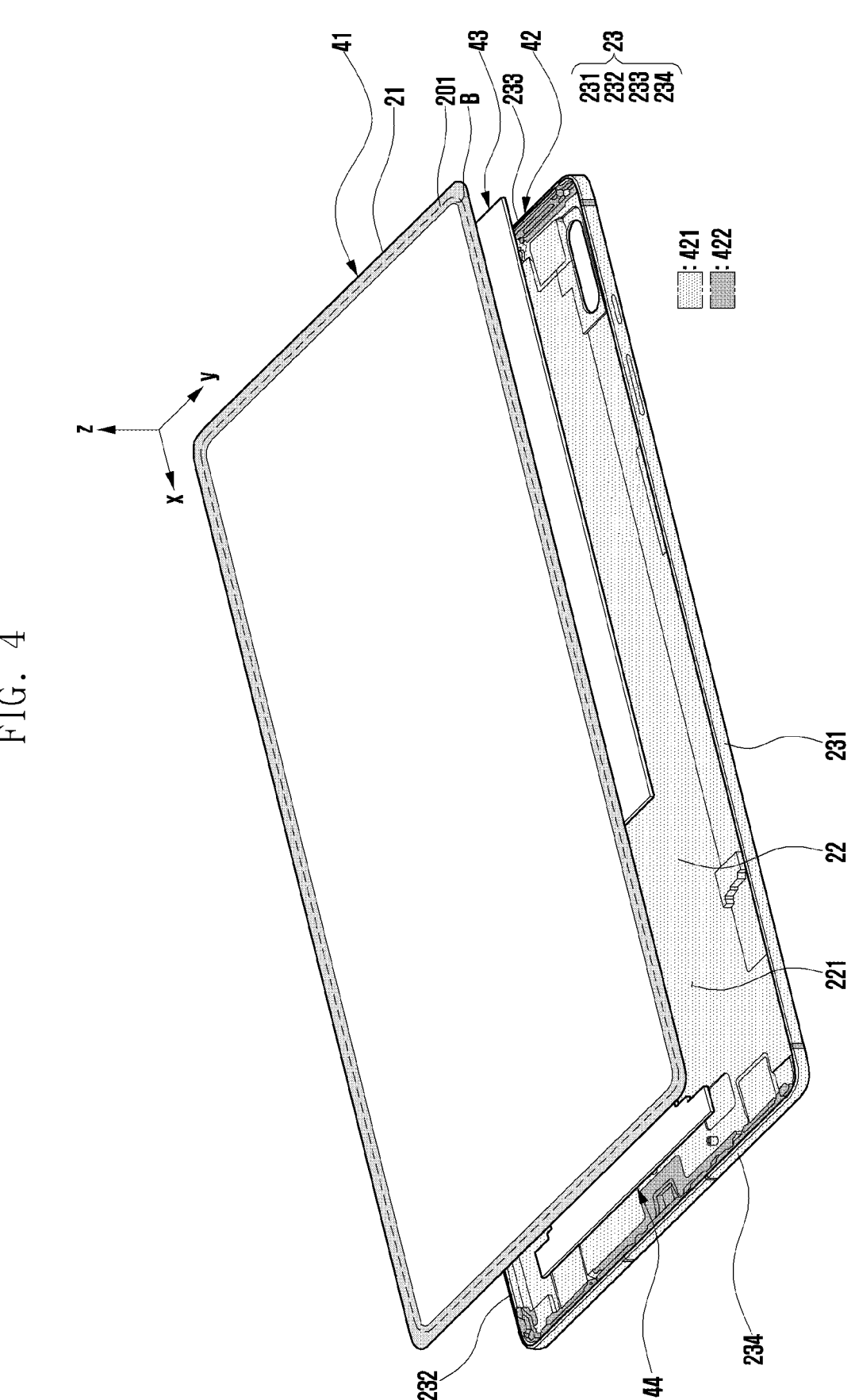
FIG. 4 is an exploded perspective view of an electronic device according to various embodiments.

FIG. 4 is an exploded perspective view of an electronic device 2 according to various embodiments.

Referring to FIG. 4, the electronic device 2 may include a display assembly 41, a case 42, a first circuit board assembly 43, and/or a second circuit board assembly 44. The display assembly 41 may include a front plate 21 and a display 201 disposed on the rear surface of the front plate 21. An optical transparent adhesive member such as optical clear adhesive (OCA), an optical clear resin (OCR), or a super view resin (SVR) may be positioned between the front plate 21 and the display 201. The front plate 21 may include a bezel area B which does not overlap with the display area 2011 of the display 201. The case 42 may include a rear plate 22, a first side wall 231, a second side wall 232, a third side wall 233, and/or a fourth side wall 234. The front plate 21 and the case 42 may be coupled to form an inner space of the electronic device 2, in which the display 201, the first circuit board assembly 43, the second circuit board assembly 44, or various elements not illustrated may be positioned. The display assembly 41, the first circuit board assembly 43, the second circuit board assembly 44, various electronic components not illustrated, or various members associated with electronic components may be arranged in the case 42 or supported by the case 42. The case 42 may be included in the electronic device 2 so as to contribute to the durability or rigidity (e.g., torsional rigidity) of the electronic device 2. The case 42 may be referred to as various other terms such as "a frame", "a frame structure", "a framework", etc.

According to an embodiment, the case 42 may include a conductive structure (or a conductive portion) 421 including a metal material and a non-conductive structure (or a non-conductive portion) 422 including a non-metal material. A part of the conductive structure 421 and a part of the non-conductive structure 422 may be included in the rear plate 22. Another part of the conductive structure 421 and another part of the non-conductive structure 422 may be included in the lateral member 23. The conductive structure 421 may provide a part of the outer surface of the electronic device 2, and the non-conductive structure 422 may provide a part of the outer surface of the electronic device 2. For example, the conductive structure 421 may include titanium, an amorphous alloy, a metal-ceramic composite material (e.g., cermet), or stainless steel. For another example, the conductive structure 421 may include magnesium, a magnesium alloy, an aluminum, aluminum alloy, a zinc alloy, or a copper alloy. The conductive structure 421 may include various other metal materials. The non-conductive structure 422 may include various polymers such as engineering plastic (e.g., polycarbonate (PC) or polymethyl methacrylate (PMMA)). For example, the non-conductive structure 422 may include polymer resin such as polyether ether ketone, polyphenylene sulfide, polybutylene terephthalate, polyimide, or polycarbonate. In various embodiments, the non-conductive structure 422 may include a material (e.g., fiber reinforced plastic (FRP)) in which engineering plastic is mixed with various reinforcing substrates such as glass fiber or carbon fiber. The conductive structure 421 may be implemented using a processing method such as computer numerical control (CNC), die casting, or pressing. In an embodiment, the non-conductive structure 422 may be molded in a form coupled to the conductive structure 421 using insert molding.

According to an embodiment, the conductive structure 421 may include multiple conductive parts. The non-conductive structure 422 may provide an insulation part disposed in a segment part between the multiple conductive parts. The multiple conductive parts included in the conductive structure 421 may be coupled to the non-conductive structure 422 and be in a physically separate state therefrom. The insulation part by the non-conductive structure 422 may provide a part of the outer surface of the electronic device 2. A part of the outer surface of the electronic device 2, which is provided by the insulation part, may be smoothly connected to a part of the outer surface of the electronic device 2, which is provided by the conductive structure 421, without a substantial difference in height.

According to an embodiment, a part of the multiple conductive parts included in the conductive structure 421 may be utilized as an antenna radiator. A conductive part included in the conductive structure 421 may be electrically connected to a communication circuit (e.g., the wireless communication module 192 in FIG. 1) and thus may operate as an antenna radiator capable of transmitting an electromagnetic signal to the outside of the electronic device 2 and/or receiving an electromagnetic signal from the outside of the electronic device 2.

According to an embodiment, the first circuit board assembly 43 and the second circuit board assembly 44 may be positioned between the display assembly 41 and the case 42 (or the rear plate 22). The first circuit board assembly 43 and the second circuit board assembly 44 may be arranged on or coupled to the rear plate 22. The rear plate 22 may be used to stably position the electronic components or various members associated with electronic components in the inside of the electronic device 2. The rear plate 22 may provide a support surface 221 oriented in a direction opposite to the direction in which the rear surface 20B (see FIG. 3) of the electronic device 2 and the rear surface 20B are oriented. The first circuit board assembly 43, the second circuit board assembly 4, various electronic components not illustrated, or various members associated with electronic components may be arranged on or supported by the support surface 221. The support surface 221 may include an area provided by the conductive structure 421 and/or an area provided by the non-conductive structure 422. In various embodiments, the electronic device 2 may be implemented to include a bracket (or a support, a support member, or a support structure) positioned between the front plate 21 and the rear plate 22 so as to arrange or support electronic components or various members associated with electronic components. In this case, the display 201 may be disposed on or supported by a surface facing the front plate 21 of the bracket, and the first circuit board assembly 43 and the second circuit board assembly 440 may be arranged on or supported by a surface facing the rear plate 22 of the bracket. The bracket may be connected to the lateral member 23 or integrally formed with the lateral member 23.

According to an embodiment, the first circuit board assembly (or a first printed circuit board assembly (PBA)) 43 may include a first printed circuit board and a second printed circuit board. The second printed circuit board may be coupled to the first printed circuit board so as to at least partially overlap the first printed circuit board. The first printed circuit board may include a first surface facing the front plate 21 and a second surface oriented in a direction (e.g., a direction toward the rear plate 22) opposite to the first surface. The second printed circuit board may include a third surface facing the first surface of the first printed circuit board and a fourth surface oriented in a direction (e.g., a direction toward the front plate 21) opposite to the third surface. The first circuit board assembly 43 may include multiple conductive portions (or multiple conductive bonding members) arranged between the first surface of the first printed circuit board and the third surface of the second printed circuit board. The multiple conductive portions may electrically and mechanically connect the first printed circuit board and the second printed circuit board. The multiple conductive portions may include a conductive adhesive material such as solder. The first circuit board assembly 43 may include multiple electronic components arranged on the first surface or the second surface of the first printed circuit board. The first circuit board assembly 43 may include multiple electronic components arranged on the third surface or the fourth surface of the second printed circuit board. Various electronic components may be electrically connected to the first printed circuit board through an electrical path such as a cable or a flexible printed circuit board (FPCB).

According to an embodiment, the second circuit board assembly (or a second PBA) 44 may include a third printed circuit board. The third printed circuit board may be disposed on the rear plate 22 to be substantially parallel to the first printed circuit board of the first circuit board assembly 43. The second circuit board assembly 44 may include multiple electronic components arranged on a third printed circuit board. Various electronic components may be electrically connected to the third printed circuit board through an electrical path such as a cable or a flexible printed circuit board. The second circuit board assembly 44 may not overlap with the first circuit board assembly 43 when seen from above the front plate 21 (e.g., when seen in the −z-axis direction). On the support surface 221 of the rear plate 22, an area where the first circuit board assembly 43 is disposed may be different from an area where the second circuit board assembly 44 is disposed.

According to an embodiment, the first printed circuit board of the first circuit board assembly 43 and the third printed circuit board of the second circuit board assembly 44 may be electrically connected through an electrical path such as a cable or a flexible printed circuit board. A signal between an electronic component included in the first circuit board assembly 43 and an electronic component included in the second circuit board assembly 44 may be delivered through an electrical path connecting the first printed circuit board and the second printed circuit board.

Figure 5:
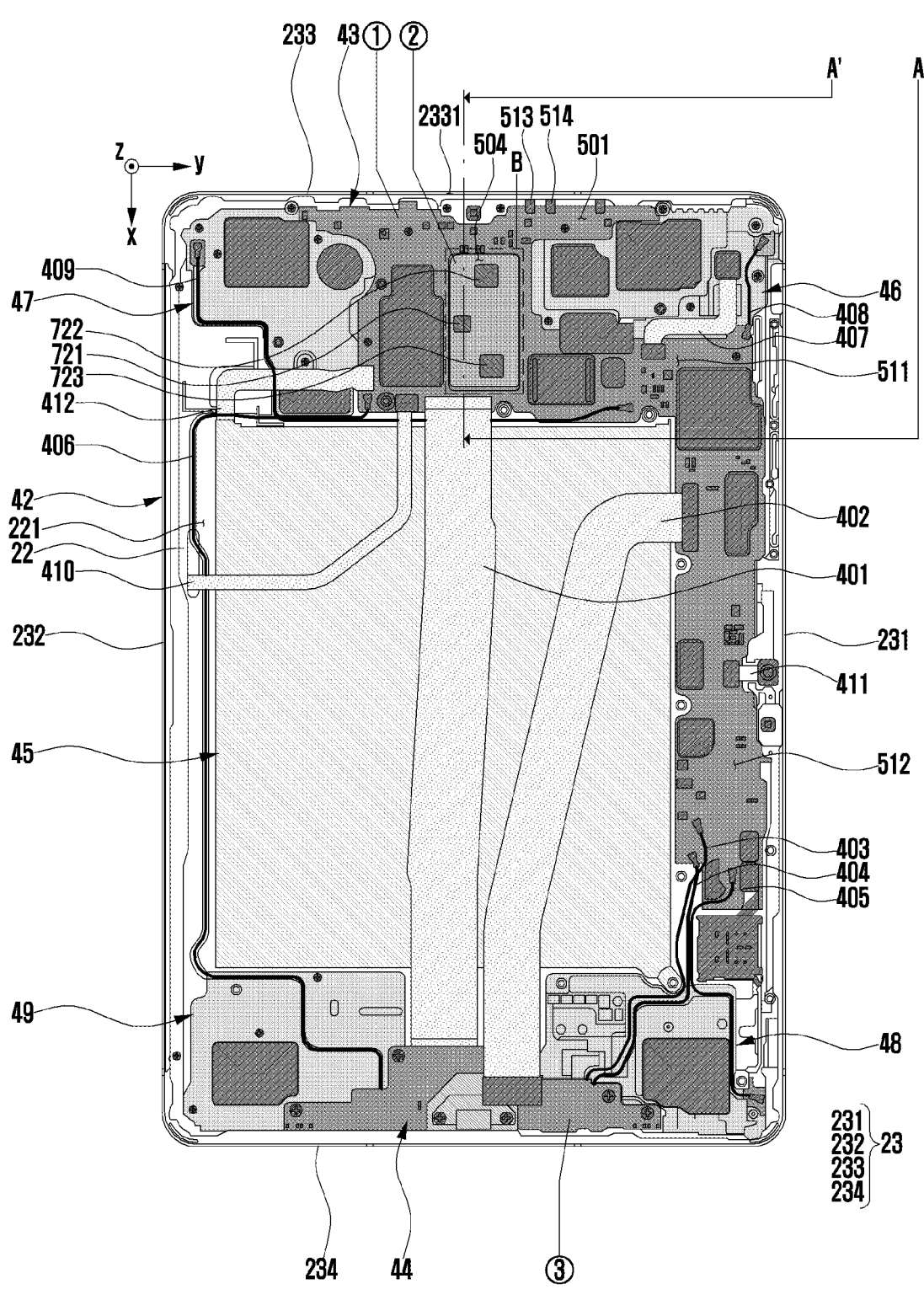
FIG. 5 is a diagram illustrating a state in which a display assembly is separated from an electronic device according to various embodiments.

FIG. 5 is a diagram illustrating a state in which a display assembly 41 (see FIG. 4) is separated from an electronic device 2 according to various embodiments.

Referring to FIG. 5, the electronic device 2 may include the case 42, the first circuit board assembly 43, the second circuit board assembly 44, a battery 45, multiple component assemblies 46, 47, 48, and 49, and/or multiple electrical connection members 401, 402, 403, 404, 405, 406, 407, 408, 409, 410, and 411.

The first circuit board assembly 43, the second circuit board assembly 44, and the battery 45 may be arranged on the support surface 221 of the case 42. The support surface 221 of the rear plate 22 may be a surface facing the front plate 21. When seen from above the front plate 21 (see FIG. 4) of the electronic device 2 (e.g., when seen in the −z-axis direction), the first circuit board assembly 43, the second circuit board assembly 44, and the battery 45 may not substantially overlap with each other. The support surface 221 may include a first support area for disposing or supporting the first circuit board assembly 43, a second support area for disposing or supporting the second circuit board assembly 44, and a third support area for disposing or supporting the battery 45.

For example, the first support area of the support surface 221 may include a first seat structure capable of stably positioning the first circuit board assembly 43 on the rear plate 22, and screw fastening parts for supporting screw fastening between the rear plate 22 and the first circuit board assembly 43, based on the first seat structure. For example, the first seat structure may include a recess structure or a fitting structure which allows the first circuit board assembly 43 to be stably positioned on the rear plate 22 without shaking. Each of the screw fastening parts may be a boss including a female thread corresponding to the male thread of a screw. The screw fastening parts may be formed in the first seat structure to support screw fastening between the first circuit board assembly 43 and the rear plate 22. In various embodiments, the first seat structure may further include a hook structure for supporting snap-fit fastening between the first circuit board assembly 43 and the rear plate 22. For example, when the first circuit board assembly 43 is positioned in the first seat structure, at least one hook structure formed in the first seat structure may be fastened to at least one hook fastening structure (or an engagement structure) formed in the first circuit board assembly 43. In various embodiments, the first circuit board assembly 43 may include at least one hook structure, and the first seat structure may include at least one hook fastening structure corresponding thereto.

For example, the second support area of the support surface 221 may include a second seat structure capable of stably positioning the second circuit board assembly 44 on the rear plate 22, and screw fastening parts for supporting screw fastening between the rear plate 22 and the second circuit board assembly 44, based on the second seat structure. For example, the second seat structure may include a recess structure or a fitting structure which allows the second circuit board assembly 44 to be stably positioned on the rear plate 22 without shaking. In various embodiments, the second seat structure may further include a hook structure for supporting snap-fit fastening between the second circuit board assembly 44 and the rear plate 22.

For example, the third support area of the support surface 221 may include a third seat structure capable of stably positioning the battery 45 on the rear plate 22. The third seat structure may include a recess structure or a fitting structure which allows the battery 45 to be stably positioned on the rear plate 22 without shaking. The battery 45 may be disposed in the third seat structure using mechanical coupling such as screw fastening or bonding including an adhesive material.

According to an embodiment, the first circuit board assembly 43 may include a first printed circuit board (1) and a second printed circuit board (2). The second circuit board assembly 44 may include a third printed circuit board (3). The first printed circuit board (1) may include a first substrate area 511 and a second substrate area 512 extending from the first substrate area 511. When seen from above the front plate 21 (see FIG. 4) (e.g., when seen in the −z-axis direction), the first substrate area 511 may be disposed on the support surface 221 to be closer to the third side wall 233 than the third printed circuit board (3). When seen from above the front plate 21, the third printed circuit board (3) may be disposed on the support surface 221 to be closer to the fourth side wall 234 than the first substrate area 511. When seen from above the front plate 21, the battery 45 may be disposed on the support surface 221 between the first substrate area 511 and the third printed circuit board (3). When seen from above the front plate 21, the second substrate area 512 may extend from the first substrate area 511 to between the battery 45 and the first side wall 231 so as to be disposed on the support surface 221. The second printed circuit board (2) may be coupled to the first printed circuit board (1) so as to at least partially overlap the first printed circuit board (1). In various embodiments, an integrated printed circuit board including a first printed circuit board (1) and a third printed circuit board (3) may be provided. For example, when seen from above the front plate 21 (see FIG. 4) (e.g., when seen from in the −z-axis direction), the integrated printed circuit board may include a first portion and a second portion which are arranged on the support surface 221 to be spaced apart from each other with the battery 45 interposed between, and a third portion which extends between the battery 45 and the first side wall 231 and connects the first portion and the second portion. The second printed circuit board (2) may be coupled to the first substrate area 511 to overlap the first substrate area 511. The second printed circuit board (2) may be positioned closer to the front plate 21 than the first substrate area 511.

The first printed circuit board (1) may include a first surface 501 facing the front plate 21, and a second surface which is oriented in a direction opposite to the first surface 501 and faces the support surface 221. The second printed circuit board (2) may include a third surface facing the first surface 501 of the first printed circuit board (1), and a fourth surface 504 oriented in a direction opposite to the third surface. The first circuit board assembly 43 may include multiple conductive portions (or multiple conductive bonding members) arranged between the first surface 501 of the first printed circuit board (1) and the third surface of the second printed circuit board (2). The multiple conductive portions may electrically and mechanically connect the first printed circuit board (1) and the second printed circuit board (2). The multiple conductive portions may include a conductive adhesive material such as solder. A part of the multiple conductive portions may be configured to function as a part of a signal line through which a signal is transferred between the first printed circuit board (1) and the second printed circuit board (2). The other of the multiple conductive portions may be configured to function as a part of a power line through which power is provided from the first printed circuit board (1) to the second printed circuit board (2). A part of the multiple conductive portions may be configured to function as a part of a ground path for electrically connecting a first ground area (e.g., a first ground plane) included in the first printed circuit board (1) and a second ground area (e.g., a second ground plane) included in the second printed circuit board (2).

According to an embodiment, the component assembly 46, 47, 48, or 49 may be an assembly including a non-conductive support member (or non-conductive support) and one or more electronic components arranged on the non-conductive support member. In the illustrated example, when seen from above the front plate 21 (see FIG. 4) (when seen the −z-axis direction), each of the first component assembly 46 and the second component assembly 47 may have at least a part positioned between the battery 45 and the third side wall 233, and the first component assembly and the second component assembly may be coupled to the support surface 221 of the rear plate 22 using screw fastening. A part of the first substrate area 511 may be disposed between the first component assembly 46 and the support surface 221. A part of the first substrate area 511 may be disposed between the second component assembly 47 and the support surface 221. In the illustrated example, when seen from above the front plate 21, each of the third component assembly 48 and the fourth component assembly 49 may have at least a part positioned between the battery 45 and the fourth side wall 234, and the third component assembly and the fourth component assembly may be coupled to the support surface 221 of the rear plate 22 using screw fastening. A part of the third printed circuit board (3) may be disposed between the third component assembly 48 and the support surface 221. A part of the third printed circuit board (3) may be disposed between the fourth component assembly 49 and the support surface 221.

According to an embodiment, when seen from above the front plate 21 (e.g., when seen in the −z-axis direction), the first printed circuit board (1) may have a larger area compared to the second printed circuit board (2), and thus the first printed circuit board (1) may be used for electrical connection between the first circuit board assembly 43 and other elements therearound. The first printed circuit board (1) and the third printed circuit board (3) may be electrically connected through the electrical connection member 401 or 402 such as a flexible printed circuit board. The first printed circuit board ① and the third printed circuit board ③ may be electrically connected through the electrical connection member 403, 404, 405, or 406 such as a cable. The first printed circuit board ① may be electrically connected to an electronic component disposed in the first component assembly 46 through the electrical connection member 407 such as a flexible printed circuit board, or the electrical connection member 408 such as a cable. The first printed circuit board ① may be electrically connected to an electronic component disposed in the second component assembly 47 through the electrical connection member 409 such as a cable. The first printed circuit board ① may be electrically connected to an electronic component disposed in the case 42 through the electrical connection member 410 or 411 such as a flexible printed circuit board. The first printed circuit board ① may be electrically connected to the battery 45 through the electrical connection member 412 such as a flexible printed circuit board.

According to an embodiment, at least a part of the multiple conductive parts included in the lateral member 23 of the electronic device 2 may be electrically connected to a communication circuit (or a wireless communication circuit) (e.g., the wireless communication module 192 in FIG. 1) of the electronic device 2 so as to operate as an antenna radiator (or an emission part). The communication circuit may process a transmission signal or a reception signal in at least one selected or designated frequency band through the antenna radiator including the conductive parts included in the lateral member 23. For example, the selected or designated frequency band may include at least one of a low band (LB) (about 600 MHz-about 1 GHz), a middle band (MB) (about 1 GHz-about 2.3 GHz), a high band (HB) (about 2.3 GHz-about 2.7 GHz), or an ultra-high band (UHB) (about 2.7 GHz-about 6 GHz). The selected or designated frequency band may include various other frequency bands. For example, a conductive part 2331 included in the third side wall 233 may emit (or transmit) an electromagnetic signal, which is provided (or fed) from a communication circuit, to the outside of the electronic device 2, or may operate as an antenna radiator receiving an electromagnetic signal from the outside of the electronic device 2. The conductive part 2331 included in the third side wall 233 may be electrically connected to a communication circuit included in the first circuit board assembly 43 through a first flexible conductive member 513 disposed on the first printed circuit board ①. The conductive part 2331 included in the third side wall 233 may be electrically connected to a ground area (e.g., an antenna ground) included in the first circuit board assembly 43 through a second flexible conductive member 514 disposed on the first printed circuit board ①. The first flexible conductive member 513 or the second flexible conductive member 514 may be in elastic contact with the conductive part 2331 included in the third side wall 233, or a portion protruding and extending from the conductive part 2331 toward the first flexible conductive member 513. For example, the first flexible conductive member 513 or the second flexible conductive member 514 may include a conductive clip (e.g., a conductive structure including an elastic structure), a pogo-pin, a spring, conductive PORON, a conductive rubber, a conductive tape, or a conductive connector. In case that a communication circuit provides an emission current to the conductive part 2331 included in the third side wall 233 through the first flexible conductive member 513, the conductive part 2331 may form a signal path between a feed point in contact with the first flexible conductive member 513 and a ground point in contact with the second flexible conductive member 514.

The conductive part 2331 included in the third side wall 233 may form an electrical path (e.g., a length represented by a wavelength ratio) corresponding to a signal path to operate as an antenna radiator having a resonant frequency corresponding to the electrical path. The communication circuit may be disposed on the first printed circuit board ①. In various embodiments, the communication circuit may be disposed on the second printed circuit board ②. Other conductive parts included in the lateral member 23 may operate as antenna radiators, by substantially the same method as or similar method to the method in which the conductive part 2331 included in the third side wall 233 is implemented as an antenna radiator.

Figure 6:
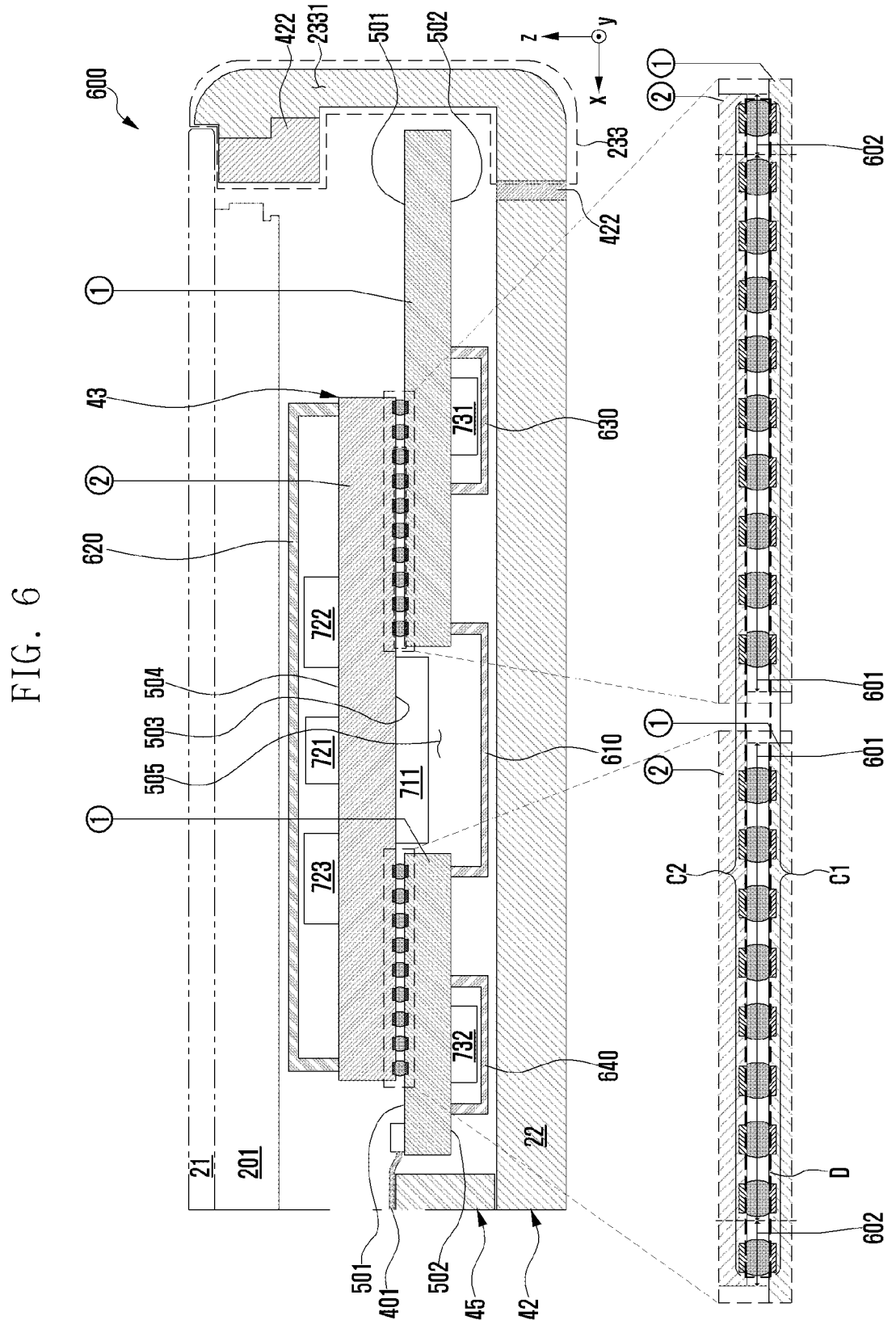
FIG. 6 is a cross-sectional view of an electronic device taken along line A-A' in FIG. 5 according to various embodiments.
Figure 7:
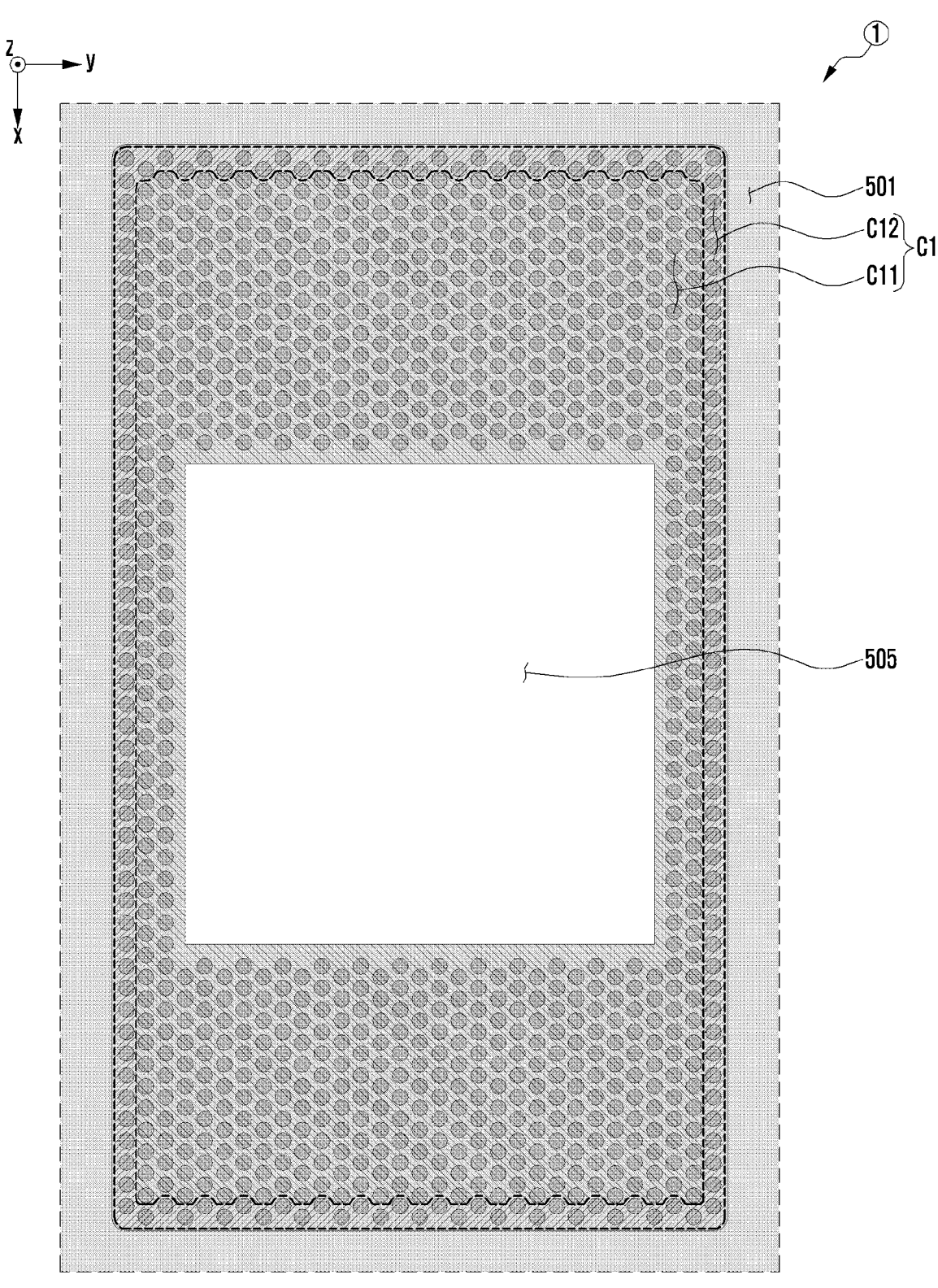
FIG. 7 is a diagram illustrating a first printed circuit board included in a portion indicated by reference numeral "B" in FIG. 5 according to various embodiments.
Figure 8:
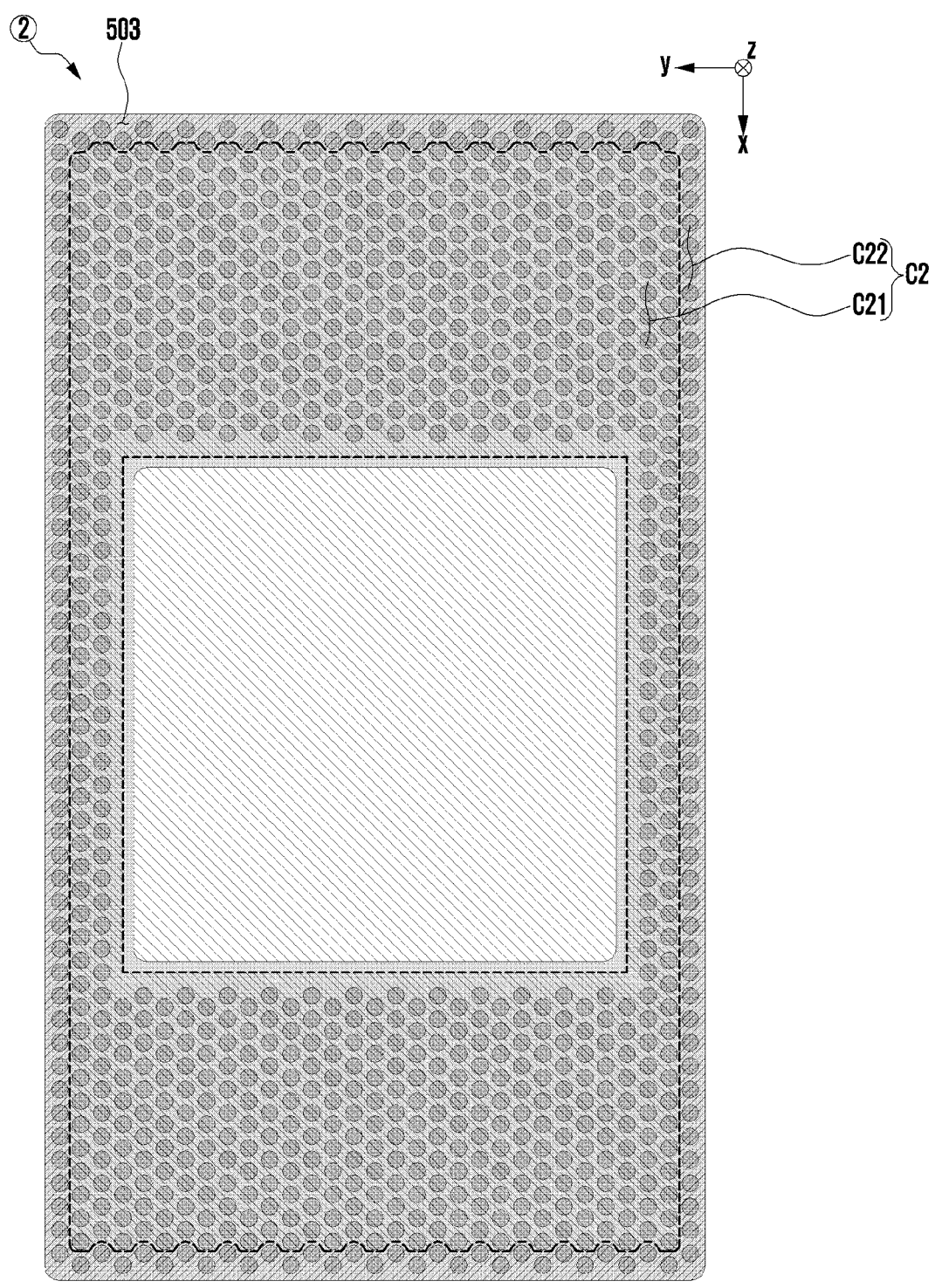
FIG. 8 is a diagram illustrating a second printed circuit board according to various embodiments.
Figure 9:
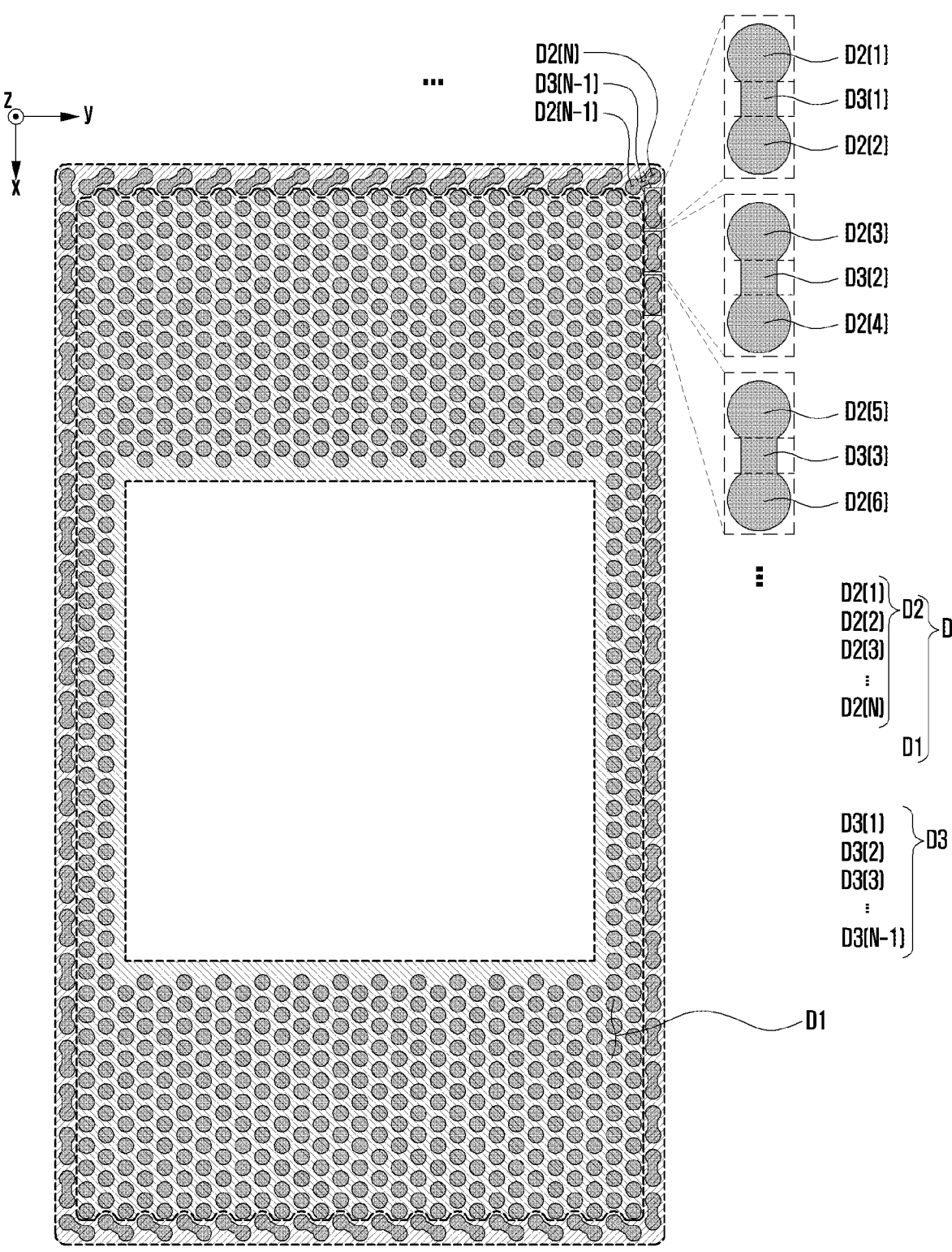
FIG. 9 is a cross-sectional view illustrating multiple conductive portions arranged between a first printed circuit board and a second printed circuit board according to various embodiments.

FIG. 6 is a cross-sectional view 600 of the electronic device 2 taken along line A-A' in FIG. 5 according various embodiments. FIG. 7 is a diagram illustrating a first printed circuit board ① included in a portion indicated by reference numeral "B" in FIG. 5 according to various embodiments. FIG. 8 is a diagram illustrating a second printed circuit board ② according to various embodiments. FIG. 9 is a cross-sectional view illustrating multiple conductive portions arranged between a first printed circuit board ① and a second printed circuit board ② according to various embodiments.

Referring to FIG. 6, the electronic device 2 may include the case 42, the first printed circuit board ①, the second printed circuit board ②, multiple conductive portions D, a first electromagnetic shielding member 610, a second electromagnetic shielding member 620, a third electromagnetic shielding member 630, and/or a fourth electromagnetic shielding member 640.

For example, the first printed circuit board ① or the second printed circuit board ② may include multiple conductive layers stacked, and a dielectric (or an insulator) at least partially disposed between the multiple conductive layers. Each of the conductive layers may include at least one conductive pattern. At least one conductive pattern included in any conductive layer among the multiple conductive layers may be used as a signal line (or an electrical path). At least one conductive pattern included in any conductive layer among the multiple conductive layers may be used as a ground plane. A conductive pattern used as at least part of a signal line may be referred to as a "signal line pattern", and a conductive pattern used as at least part of a ground plane may be referred to as a "ground pattern". The first printed circuit board ① or the second printed circuit board ② may include multiple conductive vias. The conductive vias may be conductive holes in which connection wires for electrically connecting conductive patterns of the conductive layers different from each other are arranged. For example, the conductive vias may include a plated through-hole (PTH), a laser via hole (LVH), a buried via hole (BVH), or a stacked via.

For example, at least one signal line included in the first printed circuit board ① or the second printed circuit board ② may include multiple signal line patterns included in layers different from each other and one or more conductive vias for electrically connecting the multiple signal line patterns.

The first printed circuit board ① may include a first ground area. For example, the first ground area may include multiple ground patterns (e.g., multiple ground planes) included in conductive layers different from each other and one or more conductive vias for electrically connecting the multiple ground patterns. The first ground area may not be short-circuited with at least one signal line, and thus a signal or power delivered through at least one signal line may be maintained. The first ground area may function as an EMI shielding structure for reducing the electromagnetic influence (e.g., electromagnetic interference (EMI)) on at least one signal line. The first ground area may reduce electromagnetic interference between the multiple signal lines.

The second printed circuit board ② may include a second ground area. For example, the second ground area may include multiple ground patterns (e.g., multiple ground planes) included in conductive layers different from each other and one or more conductive vias for electrically connecting the multiple ground patterns. The second ground area may not be short-circuited with at least one signal line, and thus a signal or power delivered through at least one signal line may be maintained. The second ground area may function as an EMI shielding structure for reducing the electromagnetic influence on at least one signal line. The second ground area may reduce electromagnetic interference between the multiple signal lines.

According to an embodiment, the multiple conductive portions D may be arranged between the first surface 501 of the first printed circuit board ① and the third surface 503 of the second printed circuit board ②. The multiple conductive portions D may electrically and mechanically connect the first printed circuit board ① and the second printed circuit board ②. The multiple conductive portions D may include conductive adhesive materials such as solder. By the method in which the multiple conductive portions D are arranged between the first printed circuit board ① and the second printed circuit board ②, the thickness of the circuit board assembly may be reduced to contribute to the slimness of the electronic device 2, compared to the comparative example in which an interposer substrate is disposed between two printed circuit boards. In the disclosure, what is referred to as a "comparative example" may be merely presented for comparison with an embodiment of the disclosure, and does not have a status prior to the embodiments of the disclosure.

According to an embodiment, a first area 601 and a second area 602 may be provided between the first surface 501 of the first printed circuit board ① and the third surface 503 of the second printed circuit board ②. When seen from above the front plate 21 (e.g., when seen in the −z-axis direction), the second area 602 may at least partially surround the first area 601. For example, the second area 602 may be positioned along the side surface (e.g., a surface connecting the third surface 503 and the fourth surface 504) of the second printed circuit board ②. Multiple first conductive portions D1 (see FIG. 9) among the multiple conductive portions D may be arranged in the first area 601. Multiple second conductive portions D2 (see FIG. 9) among the multiple conductive portions D may be arranged in the second area 602. The cross-sectional view 600 in FIG. 6 merely shows the multiple conductive portions D in order to easily explain the technical content and help understanding of the embodiment, and the position and number thereof may be various.

According to an embodiment, a part of the multiple conductive portions D1 (see FIG. 9) may be configured to function as a part of a signal line through which a signal is transferred between the first printed circuit board ① and the second printed circuit board ②. A part of the multiple conductive portions D1 may be configured to function as a part of a power line through which power is provided from the first printed circuit board ① to the second printed circuit board ②. In various embodiments, a signal line may include, for example, a power line. A part of the multiple conductive portions D1 may be configured to function as a part of a ground path for electrically connecting a first ground area included in the first printed circuit board ① and a second ground area included in the second printed circuit board ②.

According to an embodiment, corresponding to the multiple conductive portions D, the first printed circuit board ① may include multiple first lands C1, and the second printed circuit board ② may include multiple second lands C2. The multiple first lands C1 may be conductive pads (e.g., copper foil pads) or conductive terminals exposed on the first surface 501 of the first printed circuit board ① in order to electrically and mechanically connect the first printed circuit board ① to the second printed circuit board ②. An area of the first surface 501, which excludes the multiple first lands C1, may be provided as an insulation area made of a non-conductive material. At least one of the multiple first lands C1 may be configured to function as a part of a signal line included in the first printed circuit board ① as a signal line pattern. At least one of the multiple first lands C1 may be configured to function as a part of a first ground area included in the first printed circuit board ① as a ground pattern. The multiple second lands C2 may be conductive pads (e.g., copper foil pads) or conductive terminals exposed on the third surface 503 of the second printed circuit board ② in order to electrically and mechanically connect the second printed circuit board ② to the first printed circuit board ①. An area of the third surface 503, which excludes the multiple second lands C2, may be provided as an insulation area made of a non-conductive material. At least one of the multiple second lands C2 may be configured to function as a part of a signal line included in the second printed circuit board ② as a signal line pattern. At least one of the multiple second lands C2 may be configured to function as a part of a second ground area included in the second printed circuit board ② as a ground pattern. Some (e.g., the multiple lands C11 in FIG. 7) of the multiple first lands C1, which correspond to the multiple first conductive portions D1, and some (e.g., the multiple lands C21 in FIG. 8) of the multiple second lands C2, which correspond to multiple first conductive portions D1 may be aligned to be in a one-to-one correspondence relationship, and may be electrically and mechanically connected through the multiple first conductive portions D1. Some (e.g., the multiple lands C12 in FIG. 7) of the multiple first lands C1, which correspond to the multiple second conductive portions D2, and some (e.g., the multiple lands C22 in FIG. 7) of the multiple second lands C2, which correspond to multiple second conductive portions D2 may be aligned to be in a one-to-one correspondence relationship, and may be electrically and mechanically connected through the multiple second conductive portions D2.

According to an embodiment, the first circuit board assembly 43 may include a first electronic component 711 disposed on the third surface 503 of the second printed circuit board ②. The second printed circuit board ② may include multiple lands for arranging the first electronic component 711 on the second printed circuit board ° using a conductive adhesive material such as solder. For example, the first electronic component 711 may include a processor (e.g., the processor 120 in FIG. 1) such as an application processor (AP). The first circuit board assembly 43 may include a second electronic component 721, 722, or 723 disposed on the fourth surface 504 of the second printed circuit board ②. The second printed circuit board ② may include multiple lands for arranging the second electronic component 721, 722, or 723 on the second printed circuit board ② using a conductive adhesive material such as solder. For example, the second electronic component 721,

722, or 723 may include a PMIC. The second electronic component 722 or 723 may include a processor PMIC (e.g., AP PMIC). In addition, electronic components arranged on the second printed circuit board ② may be various, such as a passive element or an electrical element (e.g., a lumped element) having a characteristic such as inductance, capacitance, or conductance, an IC to provide various functions.

According to an embodiment, the first circuit board assembly 43 may include a third electronic component 731 or 732 disposed on the second surface 502 of the first printed circuit board ①. The first printed circuit board ① may include multiple lands for arranging the third electronic component 731 or 732 on the first printed circuit board ① using a conductive adhesive material such as solder. For example, the third electronic component 731 may include an over voltage protection (OVP) IC. For example, the third electronic component 732 may include a radio frequency power amplifier (RF PA) or an RF power amplifier module (PAM). Without being limited to the RF PA or the RF PAM, various circuits or elements (e.g., the wireless communication module 192 in FIG. 1) associated with an antenna may be arranged on the first printed circuit board ①. In addition, electronic components arranged on the first printed circuit board ① may be various, such as an electrical element having a characteristic such as inductance, capacitance, or conductance, or an IC to provide various functions.

According to an embodiment, the first printed circuit board ① may include an opening 505 penetrating between the first surface 501 and the second surface 502. When seen from above the front plate 21 (e.g., when seen in the −z-axis direction), the opening 505 may overlap the second printed circuit board ②. The first electronic component 711 (e.g., an AP) disposed on the third surface 503 of the second printed circuit board ② may be inserted in the opening 505 of the first printed circuit board ①. When seen from above the front plate 21 (e.g., when seen in the −z-axis direction), a stacked structure including the first printed circuit board ① and the second printed circuit board ②, and the arrangement method in which the first electronic component 711 is inserted in the opening 505 may contribute to securing a component mounting area while reducing the area of the printed circuit board, compared to the electronic device of the comparative example including one printed circuit board. The arrangement method in which the first electronic component 711 is inserted in the opening 505 may contribute to slimness of the stacked structure including the first printed circuit board ① and the second printed circuit board ②. When seen from above the front plate 21, the opening 505 may be positioned to be surrounded by the multiple first conductive portions D1 (see FIG. 9).

According to an embodiment, the number of conductive layers stacked on the first printed circuit board ① may be different from the number of conductive layers stacked on the second printed circuit board ②. The second printed circuit board ② may include a larger number of stacked conductive layers than those of the first printed circuit board ①. Since a processor (e.g., the first electronic component 711) disposed on the second printed circuit board ② may control at least one other element (e.g., a hardware or a software element) of the electronic device 101 and may perform various data processing or arithmetic operations, the second printed circuit board ② may include a number of conductive layers more than the number of those of the first printed circuit board ①, to easily implement multiple signal lines connected to the processor. The second printed circuit board ② on which the processor is disposed may include a number of conductive layers more than the number of those of the first printed circuit board ① in order to support higher density of signal lines than first printed circuit board ①. Since the second printed circuit board ② on which the processor is disposed includes conductive layers more than those of the first printed circuit board ①, it may be easy to implement signal lines including signal line patterns and conductive vias with higher density than the first printed circuit board ① in an area under the same condition. In an embodiment, the second printed circuit board ② may include ten stacked conductive layers, and the first printed circuit board ② may include eight stacked conductive layers.

According to various embodiments, the first printed circuit board ① and the second printed circuit board ② may include the same number of stacked conductive layers.

According to an embodiment, the distance (e.g., the thickness of the first printed circuit board ①) in which the first surface 501 is spaced apart from the second surface 502 in the +z-axis direction may be different from the distance (e.g., the thickness of the second printed circuit board ②) in which the fourth surface 504 is spaced apart from the third surface 503 in the +z direction. For example, the second printed circuit board ② may have a thickness thicker than the first printed circuit board ①. In various embodiments, the first printed circuit board ① and the second printed circuit board ② may have substantially the same thickness.

According to an embodiment, the multiple second conductive portions D2 (see FIG. 9) may electrically connect the first ground area included in the first printed circuit board ① and the second ground area included in the second printed circuit board ②. The ground structure included in the first circuit board assembly 43 may include the first ground area included in the first printed circuit board ①, the second ground area included in the second printed circuit board ②, a part of the multiple first conductive portions D1, which is used as a ground path, and the multiple second conductive portions D2. The ground structure included in the first circuit board assembly 43 may function as an EMI shielding structure for reducing electromagnetic influence on a circuit (e.g., a processor, and signal lines or various elements connected to the processor) included in the structure in which the first printed circuit board ① and the second printed circuit board ③ overlap with each other. The ground structure included in the first circuit board assembly 43 may reduce influence (e.g., signal loss or signal distortion) of electromagnetic noise generated inside the electronic device 2 or electromagnetic noise introduced from the outside of the electronic device 2, on a circuit included in the structure in which the first printed circuit board ① and the second printed circuit board ③ overlap with each other. The ground structure included in the first circuit board assembly 43 may reduce influence of an electromagnetic field generated when a current flows through a circuit included in a structure in which the first printed circuit board ① and the second printed circuit board ③ overlap with each other, on an electrical element (e.g., the conductive part 2331 of the third side wall 233, which is used as an antenna radiator) therearound.

According to an embodiment, the multiple second conductive portions D2 (see FIG. 9) may be arranged on the second area 602 between the first printed circuit board ① and the second printed circuit board ② to at least partially surround the space between the first ground area of the first printed circuit board ① and the second ground area of the second printed circuit board ②, and thus may reduce electromagnetic interference on a circuit included in the structure in which the first printed circuit board ① and the second printed circuit board ③ overlap with each other.

According to an embodiment, the first circuit board assembly 43 may include multiple third conductive portions D3 arranged in the second area 602 between the first printed circuit board ① and the second printed circuit board ②. Describing one third conductive portion D3(1), the third conductive portion D3(1) may electrically connect a pair of second conductive portions D2(1) and D2(2) adjacent to each other. The remaining third conductive portions D3(2), D3(3), . . . , and D(N–1) may be formed in substantially the same manner or a similar manner as the one third conductive portion D3(1). The multiple third conductive portions D3 may be further included in an EMI shielding structure disposed in the second area 602 between the first printed circuit board ① and the second printed circuit board ② so that the multiple second conductive portions D2 surround at least a part of the space between the first ground area of the first printed circuit board ① and the second ground area of the second printed circuit board ②, and thus may further improve EMI shielding performance. The multiple third conductive portions D3 may further strengthen the EMI shielding structure (e.g., an EMI shielding wall) to reduce electromagnetic interference on a circuit included in the structure in which the first printed circuit board ① and the second printed circuit board ③ overlap with each other. In various embodiments, the third conductive portions are not limited to the illustrated example, and each thereof may be provided in a form of connecting three or more second conductive portions.

According to an embodiment, the first electromagnetic shielding member 610 may be disposed on the second surface 502 of the first printed circuit board ①. The first electromagnetic shielding member 610 may be positioned to correspond to the opening 505 of the first printed circuit board ①. When seen from above the front plate 21 (e.g., when seen in the –z-axis direction), the first electromagnetic shielding member 610 may at least partially overlap the first electronic component 711 (e.g., a processor) disposed on the third surface 503 of the second printed circuit board ②. The first electromagnetic shielding member 610 may be an EMI shielding structure (e.g., a first shield can) for reducing electromagnetic influence on the first electronic component 711. The first electromagnetic shielding member 610 may be electrically connected to the first ground area included in the first printed circuit board ①. The first printed circuit board ① may include one or more lands for electrically and mechanically connecting the first electromagnetic shielding member 610 to the first printed circuit board ① using a conductive adhesive material such as solder, and the one or more lands may be electrically connected to the first ground plane of the first printed circuit board ①. The first electromagnetic shielding member 610 may include, for example, a part of a ground structure included in the first circuit board assembly 43.

According to an embodiment, the second electromagnetic shielding member 620 may be disposed on the fourth surface 504 of the second printed circuit board ②, and may at least partially cover one or more electronic components (e.g., the second electronic component 721, 722, or 723) arranged on the fourth surface 504. The second electromagnetic shielding member 620 may be an EMI shielding structure (e.g., a second shield can) for reducing electromagnetic influence on one or more electronic components arranged on the fourth surface 504. The second electromagnetic shielding member 620 may be electrically connected to the second ground area included in the second printed circuit board ②. The second printed circuit board ② may include one or more lands for electrically and mechanically connecting the second electromagnetic shielding member 620 to the second printed circuit board ② using a conductive adhesive material such as solder, and the one or more lands may be electrically connected to the second ground plane of the second printed circuit board ②. The second electromagnetic shielding member 620 may include, for example, a part of a ground structure included in the first circuit board assembly 43.

According to various embodiments, the second electromagnetic shielding member 620 may form at least a part of the rear surface of the display 201 or be electrically connected to a conductive plate (e.g., an EMI shielding layer for the display 201) disposed on the rear surface of the display 201. For example, a conductive adhesive material or a flexible conductive member (e.g., a conductive clip, a pogo pin, a spring, conductive PORON, a conductive rubber, or a conductive tape) may be disposed between the second electromagnetic shielding member 620 and the EMI shielding layer for the display 201, and the electromagnetic shielding member 620 and the EMI shielding layer for the display 201 may be electrically connected. In various embodiments, the second electromagnetic shielding member 620 may include an elastic structure in order to be in elastic contact with the EMI shielding layer for the display 201.

According to an embodiment, the third electromagnetic shielding member 630 may be disposed on the second surface 502 of the first printed circuit board ① so as to cover at least a part of the third electronic component 731. The third electromagnetic shielding member 630 may be an EMI shielding structure (e.g., a third shield can) for reducing electromagnetic influence on the third electronic component 731. The fourth electromagnetic shielding member 640 may be disposed on the second surface 502 of the first printed circuit board ① so as to cover at least a part of another third electronic component 732. The fourth electromagnetic shielding member 640 may be an EMI shielding structure (e.g., a fourth shield can) for reducing electromagnetic influence on the third electronic component 732. The third electromagnetic shielding member 630 and the fourth electromagnetic shielding member 640 may be electrically connected to the first ground area included in the first printed circuit board ①. The first printed circuit board ① may include multiple lands for electrically and mechanically connecting the third electromagnetic shielding member 630 and the fourth electromagnetic shielding member 640 to the first printed circuit board ① using a conductive adhesive material such as solder, and the multiple lands may be electrically connected to the first ground plane of the first printed circuit board ①. The third electromagnetic shielding member 630 and the fourth electromagnetic shielding member 640 may include, for example, a part of a ground structure included in the first circuit board assembly 43. In various embodiments, an integrated electromagnetic shielding member replacing the third electromagnetic shielding member 630 and the fourth electromagnetic shielding member 640 may be provided.

According to various embodiments, the third electromagnetic shielding member 630 or the fourth electromagnetic shielding member 640 may be electrically connected to a conductive part included in the rear plate 22. For example, a conductive adhesive material or a flexible conductive member (e.g., a conductive clip, a pogo pin, a spring, conductive PORON, a conductive rubber, or a conductive tape) may be disposed between the third electromagnetic shielding member 630 and the conductive part included in the rear plate 22, and the third electromagnetic shielding member 630 and the conductive part included in the rear plate 22 may be electrically connected. For example, a conductive adhesive material or a flexible conductive member may be disposed between the fourth electromagnetic shielding member 640 and the conductive part included in the rear plate 22, and the fourth third electromagnetic shielding member 640 and the conductive part included in the rear plate 22 may be electrically connected. In various embodiments, the third electromagnetic shielding member 630 or the fourth electromagnetic shielding member 640 may include an elastic structure in order to be in elastic contact with the conductive part included in the rear plate 22.

According to an embodiment, the second printed circuit board ② may be disposed on the first printed circuit board ① using surface mounting technology (SMT). There may be a first operation in which a conductive adhesive material (e.g., a solder cream) is printed or applied onto the first surface 501 of the first printed circuit board ①. There may be a second operation of melting a printed conductive adhesive material using heat so as to couple the second printed circuit board ② to the first printed circuit board ① after moving the second printed circuit board ② to the first printed circuit board ①. The first operation may be performed by printing a conductive adhesive material onto the first printed circuit board ① using a mask. The mask may be to distinguish an area of the first surface 501 of the first printed circuit board ①, in which a conductive adhesive material is disposed, and for example, may include a metal mask or stencil. The multiple first conductive portions D1, the multiple second conductive portions D2, and the multiple third conductive portions (D3) may be substantially provided in the first operation of printing a conductive adhesive material onto the first printed circuit board ① using a mask.

According to various embodiments, the second printed circuit board ②, as a ball grid array (BGA) method, may be provided in a form in which a conductive adhesive material for the multiple first conductive portions D1, the multiple second conductive portions D2, and the multiple third conductive portions D3 is disposed on the third surface 503.

According to various embodiments, although not illustrated, the first printed circuit board ① may be provided to further include multiple third lands corresponding to the multiple third conductive portions D3. The multiple third lands may be connected to or physically separated from some (e.g., the multiple lands C12 in FIG. 7) of the multiple first lands C1, which correspond to the multiple second conductive portions D2.

According to various embodiments, although not illustrated, the second printed circuit board ② may be provided to further include multiple fourth lands corresponding to the multiple third conductive portions D3. The multiple fourth lands may be connected to or physically separated from some (e.g., the multiple lands C22 in FIG. 8) of the multiple second lands C2, which correspond to the multiple second conductive portions D2.

According to an example embodiment of the disclosure, an electronic device (e.g., the electronic device 2 in FIG. 2) may include a first printed circuit board (e.g., the first printed circuit board ① in FIG. 6). The electronic device may include a second printed circuit board (e.g., the second printed circuit board ② in FIG. 6) disposed to at least partially overlap the first printed circuit board. The electronic device may include multiple first conductive portions (e.g., the multiple first conductive portions D1 in FIG. 9) arranged in a first area (e.g., the first area 601 in FIG. 6)

between the first printed circuit board and the second printed circuit board. The multiple first conductive portions may be configured to electrically and mechanically connect the first printed circuit board and the second printed circuit board. The electronic device may include multiple second conductive portions (e.g., the multiple second conductive portions D2 in FIG. 9) arranged in a second area (e.g., the second area 602 in FIG. 6), which is configured to surround at least a part of the first area, between the first printed circuit board and the second printed circuit board. The multiple second conductive portions may be configured to electrically and mechanically connect the first printed circuit board and the second printed circuit board. The electronic device may include multiple third conductive portions (e.g., the multiple third conductive portions D3 in FIG. 9) arranged in the second area. The multiple third conductive portions may be configured to electrically connect at least two of the multiple second conductive portions. The multiple second conductive portions may be configured to electrically connect a first ground area included in first printed circuit board and a second ground area included in the second printed circuit board.

According to an example embodiment of the disclosure, the first printed circuit board may include multiple first lands (e.g., the multiple first lands C1 of FIG. 7) provided on a surface facing the second printed circuit board. The second printed circuit board may include multiple second lands (e.g., the multiple second lands C2 in FIG. 8) provided on a surface facing the first printed circuit board. The multiple first lands and the multiple second lands may be aligned to be in a one-to-one correspondence. The multiple first conductive portions (e.g., the multiple first conductive portions D1 in FIG. 9) and the multiple second conductive portions (e.g., the multiple second conductive portions D2 in FIG. 9) may be arranged between the multiple first lands and the multiple second lands.

According to an example embodiment of the disclosure, a part of the multiple first conductive portions (e.g., the multiple first portions D1 in FIG. 9) may be a part of a signal line through which a signal is transferred between the first printed circuit board and the second printed circuit board. The other of the multiple first conductive portions may be configured to electrically connect a first ground area included in the first printed circuit board and a second ground area included in the second printed circuit board.

According to an example embodiment of the disclosure, the first printed circuit board may include an opening (e.g., the opening 505 in FIG. 7). The multiple first conductive portions (e.g., the multiple first conductive portions D1 in FIG. 7) may be positioned to at least partially surround the opening.

According to the example embodiment of the disclosure, the electronic device may further include an electronic component (e.g., the first electronic component 711 in FIG. 6) disposed on a surface of the second printed circuit board, which faces the first printed circuit board. The electronic component may be inserted in the opening (e.g., the opening 505 in FIG. 6).

According to an example embodiment of the disclosure, the electronic component (e.g., the first electronic component 711 in FIG. 1) may include a processor.

According to an example embodiment of the disclosure, the first printed circuit board may include a first surface (e.g., the first surface 501 in FIG. 6) facing the second printed circuit board and a second surface (e.g., the second surface 502 in FIG. 6) oriented in a direction opposite to the first surface. The electronic device may further include an electromagnetic shielding member (e.g., the first electro-magnetic shielding member 610 in FIG. 6) disposed on the first printed circuit board to correspond to the opening (e.g., the opening 505 in FIG. 6). The electromagnetic shielding member may be configured to at least partially overlap the electronic component (e.g., the first electronic component 711 in FIG. 6) when seen from above the second printed circuit board.

According to an example embodiment of the disclosure, the first printed circuit board may include a first surface facing the second printed circuit board and a second surface oriented in a direction opposite to the first surface. The second printed circuit board may include a third surface facing first printed circuit board and a fourth surface oriented in a direction opposite to third surface. The electronic device may include a processor (e.g., the first electronic component 711 in FIG. 1) and a PMIC (e.g., the second electronic component 721, 722, or 723 in FIG. 6). The processor may be disposed on the third surface (e.g., the third surface 503 in FIG. 6) and inserted in an opening (e.g., the opening 505 in FIG. 6) provided through the first printed circuit board. The PMIC may be disposed on a fourth surface (e.g., the fourth surface 504 in FIG. 6). The multiple first conductive portions (e.g., the multiple first conductive portions D1 in FIG. 9) may be positioned to at least partially surround the opening.

According to an example embodiment of the disclosure, the electronic device may further include a wireless communication circuit (e.g., the wireless communication module 192 in FIG. 1) disposed on a first printed circuit board (e.g., the first printed circuit board ① in FIG. 6).

According to an example embodiment of the disclosure, the second printed circuit board (e.g., the second printed circuit board ② in FIG. 6) may include a larger number of stacked conductive layers than those of the first printed circuit board (e.g., the first printed circuit board ① in FIG. 6).

According to an example embodiment of the disclosure, the multiple first conductive portions (e.g., the multiple first conductive portions D1 in FIG. 9), the multiple second conductive portions (e.g., the multiple second conductive portions D2 in FIG. 9), and the multiple third conductive portions (e.g., the multiple third conductive portions D3 in FIG. 9) may include a conductive adhesive material (e.g., solder).

According to an example embodiment of the disclosure, the electronic device may further include a housing (e.g., the housing 20 in FIG. 2). The housing may provide a front surface (e.g., the front surface 20A in FIG. 2) of the electronic device, a rear surface (e.g., the rear surface 20B in FIG. 3) of the electronic device, and a side surface of the electronic device. The electronic device may further include a display (e.g., the display 201 in FIG. 6) positioned in the housing. The display may be seen through the front surface. The first printed circuit board may include a first surface (e.g., the first surface 501 in FIG. 6) facing the front surface, and a second surface (e.g., the second surface 520 in FIG. 6) oriented in a direction opposite to the first surface. The second printed circuit board may include a third surface (e.g., the third surface 503 in FIG. 6) facing the first surface, and a fourth surface (e.g., the fourth surface 504 of FIG. 6) which is oriented in a direction opposite to the third surface and faces the display.

According to an example embodiment of the disclosure, a circuit board assembly (e.g., the first circuit board assembly 43 in FIG. 6) may include a first printed circuit board (e.g., the first printed circuit board ① in FIG. 6). The circuit board assembly may include a second printed circuit board (e.g., the second printed circuit board ② in FIG. 6) disposed to at least partially overlap the first printed circuit board. The circuit board assembly may include multiple first conductive portions (e.g., the multiple first conductive portions D1 in FIG. 9) arranged in a first area (e.g., the first area 601 in FIG. 6) between the first printed circuit board and the second printed circuit board. The multiple first conductive portions may be configured to electrically and mechanically connect the first printed circuit board and the second printed circuit board. The circuit board assembly may include multiple second conductive portions D2 arranged in a second area (e.g., the second area 602 in FIG. 6), which is configured to surround at least a part of the first area, between the first printed circuit board and the second printed circuit board. The multiple second conductive portions may be configured to electrically and mechanically connect the first printed circuit board and the second printed circuit board. The circuit board assembly may include multiple third conductive portions (e.g., the multiple third conductive portions D3 in FIG. 9) arranged in the second area. The third conductive portions may be configured to electrically connect at least two of the multiple second conductive portions. An electronic component (e.g., the first electronic component 711 in FIG. 6) disposed on a surface of the second printed circuit board, which faces the first printed circuit board, may be inserted in an opening (e.g., the opening 505 in FIG. 6) provided through the first printed circuit board. The multiple first conductive portions may be positioned to at least partially surround the opening. The multiple second conductive portions may be configured to electrically connect a first ground area included in first printed circuit board and a second ground area included in the second printed circuit board.

According to an example embodiment of the disclosure, the electronic component (e.g., the first electronic component 711 in FIG. 6) may include a processor.

According to an example embodiment of the disclosure, the first printed circuit board may include a first surface (e.g., the first surface 501 in FIG. 6) facing the second printed circuit board and a second surface (e.g., the second surface 502 in FIG. 6) oriented in a direction opposite to the first surface. The circuit board assembly may further include an electromagnetic shielding member (e.g., the first electromagnetic shielding member 610 in FIG. 6) disposed on the first printed circuit board to correspond to the opening (e.g., the opening 505 in FIG. 6). The electromagnetic shielding member may be configured to at least partially overlap the electronic component (e.g., the first electronic component 711 in FIG. 6) when seen from above the second printed circuit board.

According to an example embodiment of the disclosure, the first printed circuit board may include a first surface (e.g., the first surface 501 in FIG. 6) facing the second printed circuit board and a second surface (e.g., the second surface 502 in FIG. 6) oriented in a direction opposite to the first surface. The second printed circuit board may include a third surface (e.g., the third surface 503 of FIG. 6) facing the first printed circuit board and a fourth surface (e.g., the fourth surface 504 of FIG. 6) oriented in a direction opposite to the third surface. The circuit board assembly may further include a second electronic component (e.g., the second electronic component 721, 722, or 723 in FIG. 6) disposed on the fourth surface. The electronic component (e.g., the first electronic component 711 in FIG. 6) may include a processor, and the second electronic component may include a PMIC.

According to an example embodiment of the disclosure, the first printed circuit board may include multiple first lands (e.g., the first lands C1 in FIG. 7) provided on a surface facing the second printed circuit board. The second printed circuit board may include multiple second lands (e.g., the multiple second lands C2 in FIG. 8) provided on a surface facing the first printed circuit board. The multiple first lands and the multiple second lands may be aligned to be in a one-to-one correspondence. The multiple first conductive portions (e.g., the multiple first conductive portions D1 in FIG. 9) and the multiple second conductive portions (e.g., the multiple second conductive portions D2 in FIG. 9) may be arranged between the multiple first lands and the multiple second lands.

According to an example embodiment of the disclosure, a part of the multiple first conductive portions (e.g., the multiple first conductive portions D1 in FIG. 9) may be configured to function as a part of a signal line through which a signal is transmitted between the first printed circuit board and the second printed circuit board. The other of the multiple first conductive portions may be configured to electrically connect a first ground area included in the first printed circuit board and a second ground area included in the second printed circuit board.

According to an example embodiment of the disclosure, the second printed circuit board (e.g., the second printed circuit board ② in FIG. 6) may include multiple conductive layers stacked in a number greater than those of the first printed circuit board (e.g., the first printed circuit board ① in FIG. 6).

According to an example embodiment of the disclosure, the multiple first conductive portions (e.g., the multiple first conductive portions D1 in FIG. 9), the multiple second conductive portions (e.g., the multiple second conductive portions D2 in FIG. 9), and the multiple third conductive portions (e.g., the multiple third conductive portions D3 in FIG. 9) may include a conductive adhesive material (e.g., solder).

Embodiments disclosed in the disclosure and the drawings are merely examples presented to more easily describe the technical content and to aid in understanding of the disclosure, and are not intended to limit the scope of the disclosure. Accordingly, in connection with a scope of various embodiments of the disclosure, the scope of various embodiments of the disclosure is to be interpreted to include not only embodiments disclosed herein but also changed or modified forms. In addition, it will be understood that any of the embodiment(s) described herein may be used in conjunction with any other embodiment(s) described herein.

What is claimed is:

1. An electronic device comprising:
a housing defining a front surface of the electronic device, a rear surface of the electronic device, and a side surface of the electronic device; and
a display disposed in the housing and configured to be visible through the front surface;
a first printed circuit board, wherein the first printed circuit board comprises a first surface facing the front surface, and a second surface facing a direction opposite to the first surface;
a second printed circuit board disposed to at least partially overlap the first printed circuit board, wherein the second printed circuit board comprises a third surface facing the first surface, and a fourth surface facing a direction opposite to the third surface and configured to face to display;

multiple first conductive portions arranged in a first area between the first printed circuit board and the second printed circuit board and configured to electrically and mechanically connect the first printed circuit board and the second printed circuit board;
multiple second conductive portions arranged in a second area, surrounding at least a part of the first area, between the first printed circuit board and the second printed circuit board, and configured to electrically and mechanically connect the first printed circuit board and the second printed circuit board; and
multiple third conductive portions arranged in the second area and configured to electrically connect at least two of the multiple second conductive portions,
wherein the multiple second conductive portions are configured to electrically connect a first ground area included in the first printed circuit board and a second ground area included in the second printed circuit board.

2. The electronic device of claim 1, wherein the first printed circuit board comprises multiple first lands provided on the first surface facing the second printed circuit board,
wherein the second printed circuit board comprises multiple second lands provided on the third surface facing the first printed circuit board and aligned to be in a one-to-one correspondence with the multiple first lands, and
wherein the multiple first conductive portions and the multiple second conductive portions are arranged between the multiple first lands and the multiple second lands.

3. The electronic device of claim 1, wherein a part of the multiple first conductive portions is configured to function as a signal line through which a signal is transferred between the first printed circuit board and the second printed circuit board, and
wherein other of the multiple first conductive portions is configured to electrically connect the first ground area included in the first printed circuit board and the second ground area included in the second printed circuit board.

4. The electronic device of claim 1, wherein the first printed circuit board comprises an opening, and
wherein the multiple first conductive portions are positioned to at least partially surround the opening.

5. The electronic device of claim 4, further comprising an electronic component disposed on the third surface of the second printed circuit board facing the first printed circuit board,
wherein the electronic component is inserted in the opening of the first printed circuit board.

6. The electronic device of claim 5, wherein the electronic component comprises a processor comprising processor circuitry.

7. The electronic device of claim 5,
further comprising an electromagnetic shielding member comprising an electromagnetic shield disposed on the first printed circuit board to correspond to the opening, and
wherein the electromagnetic shielding member is configured to at least partially overlap the electronic component when viewed from above the fourth surface of the second printed circuit board.

8. The electronic device of claim 1,
further comprising a processor comprising processor circuitry disposed on the third surface of the second printed circuit board and inserted in an opening of the first printed circuit board, and a power management integrated circuit (PMIC) disposed on the fourth surface of the second printed circuit board, and wherein the multiple first conductive portions are positioned to at least partially surround the opening of the first printed circuit board.

9. The electronic device of claim 8, further comprising a wireless communication circuit disposed on the first printed circuit board.

10. The electronic device of claim 1, wherein the second printed circuit board comprises a greater number of stacked conductive layers than a number of stacked conductive layers of the first printed circuit board.

11. The electronic device of claim 1, wherein the multiple first conductive portions, the multiple second conductive portions, and the multiple third conductive portions comprise a conductive adhesive material.

12. A circuit board assembly comprising:

a first printed circuit board;

a second printed circuit board disposed to at least partially overlap the first printed circuit board;

multiple first conductive portions arranged in a first area between the first printed circuit board and the second printed circuit board and configured to electrically and mechanically connect the first printed circuit board and the second printed circuit board;

multiple second conductive portions arranged in a second area surrounding at least a part of the first area, between the first printed circuit board and the second printed circuit board, and configured to electrically and mechanically connect the first printed circuit board and the second printed circuit board; and multiple third conductive portions arranged in the second area and configured to electrically connect at least two of the multiple second conductive portions, wherein an electronic component, disposed on a surface of the second printed circuit board facing the first printed circuit board, is inserted in an opening of the first printed circuit board, wherein the multiple first conductive portions are positioned to at least partially surround the opening, wherein the multiple second conductive portions are configured to electrically connect a first ground area included in the first printed circuit board and a second ground area included in the second printed circuit board, and wherein the multiple first conductive portions, the multiple second conductive portions, and the multiple third conductive portions comprise a conductive adhesive material.

13. The circuit board assembly of claim 12, wherein the electronic component comprises a processor comprising processor circuitry.

14. The circuit board assembly of claim 12, wherein the first printed circuit board comprises a first surface facing the second printed circuit board and a second surface facing a direction opposite to the first surface, wherein the circuit board assembly further comprises an electromagnetic shielding member comprising an electromagnetic shield disposed on the first printed circuit board to correspond to the opening, and wherein the electromagnetic shielding member is configured to at least partially overlap the electronic component when viewed from above the second printed circuit board.

15. The circuit board assembly of claim 12, wherein the first printed circuit board comprises a first surface facing the second printed circuit board and a second surface facing a direction opposite to the first surface, wherein the second printed circuit board comprises a third surface facing the first printed circuit board and a fourth surface facing a direction opposite to the third surface, wherein the circuit board assembly further comprises a second electronic component disposed on the fourth surface, and wherein the electronic component comprises a processor comprising processor circuitry and the second electronic component comprises a power management integrated circuit (PMIC).

16. The circuit board assembly of claim 12, wherein the first printed circuit board comprises multiple first lands provided on a surface facing the second printed circuit board, wherein the second printed circuit board comprises multiple second lands provided on a surface facing the first printed circuit board and aligned in a one-to-one correspondence with the multiple first lands, and wherein the multiple first conductive portions and the multiple second conductive portions are arranged between the multiple first lands and the multiple second lands.

17. The circuit board assembly of claim 12, wherein a part of the multiple first conductive portions is configured to function as a signal line through which a signal is transferred between the first printed circuit board and the second printed circuit board, and wherein other of the multiple first conductive portions is configured to electrically connect the first ground area included in the first printed circuit board and the second ground area included in the second printed circuit board.

18. A circuit board assembly comprising:

a first printed circuit board:

a second printed circuit board disposed to at least partially overlap the first printed circuit board;

multiple first conductive portions arranged in a first area between the first printed circuit board and the second printed circuit board and configured to electrically and mechanically connect the first printed circuit board and the second printed circuit board;

multiple second conductive portions arranged in a second area surrounding at least a part of the first area, between the first printed circuit board and the second printed circuit board, and configured to electrically and mechanically connect the first printed circuit board and the second printed circuit board; and multiple third conductive portions arranged in the second area and configured to electrically connect at least two of the multiple second conductive portions, wherein an electronic component, disposed on a surface of the second printed circuit board facing the first printed circuit board, is inserted in an opening of the first printed circuit board, wherein the multiple first conductive portions are positioned to at least partially surround the opening, wherein the multiple second conductive portions are configured to electrically connect a first ground area included in the first printed circuit board and a second ground area included in the second printed circuit board, and wherein the second printed circuit board comprises a greater number of stacked conductive layers than a number of stacked conductive layers of the first printed circuit board.

* * * * *